(12) United States Patent
Kohda

(10) Patent No.: US 7,256,416 B2
(45) Date of Patent: Aug. 14, 2007

(54) SEMICONDUCTOR LIGHT EMITTING DEVICE

(75) Inventor: Shinichi Kohda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 70 days.

(21) Appl. No.: 10/916,669

(22) Filed: Aug. 12, 2004

(65) Prior Publication Data

US 2005/0040407 A1   Feb. 24, 2005

(30) Foreign Application Priority Data

Aug. 18, 2003  (JP)  ............................. 2003-207751
Jul. 22, 2004  (JP)  ............................. 2004-213899

(51) Int. Cl.
*H01L 29/06*  (2006.01)
(52) U.S. Cl. ............................. 257/13; 257/79; 257/94; 257/103
(58) Field of Classification Search .................. 257/13, 257/79, 94, 103
See application file for complete search history.

(56) References Cited

U.S. PATENT DOCUMENTS

2005/0064206 A1 * 3/2005 Akita et al. .................. 428/446

FOREIGN PATENT DOCUMENTS

EP      000890997 A2 *  1/1999
JP      2000-091253      3/2000

* cited by examiner

*Primary Examiner*—Long Pham
(74) *Attorney, Agent, or Firm*—Hogan & Hartson LLP

(57) ABSTRACT

Causing the growth of a GaN material with respect to a sapphire substrate using a conventional technique is inevitably followed by the occurrence of dislocations. Using a mask layer results in that the dislocations laterally flow. However, since the GaN crystal collides with a semiconductor layer that laterally grew from an adjacent region, perfect elimination of the dislocations is impossible. In view thereof, the invention is intended to provide a nitride compound-based semiconductor light emitting device which is based on using semiconductor layers that have been formed in a state of the dislocations' being less existent therein and which therefore has excellent property. To solve the above-described problems, the invention provides a semiconductor light emitting device being a gallium nitride-based semiconductor light emitting device that not only is equipped with a substrate but is also equipped with at least a first conductivity type semiconductor layer, active layer, and second conductivity type semiconductor layer in this sequential order on the substrate, wherein the first conductivity type semiconductor layer has a level difference portion the levels of which have a spacing therebetween in the lamination direction; and the dislocation density of the active layer that is formed on a portion of the first conductivity type semiconductor layer that has the higher level is lower than that of the active layer that is formed on a portion thereof that has the lower level.

16 Claims, 9 Drawing Sheets

SEMICONDUCTOR LIGHT EMITTING DEVICE

BACKGROUND OF THE INVENTION

The disclosure of Japanese Patent Application No. 2003-207751 filed Aug. 18, 2003 including specification, drawings and claims is incorporated herein by reference in its entirety.

1. Field of the Invention

The present invention relates to a gallium nitride-based semiconductor light emitting device and, more particularly, to a gallium nitride-based semiconductor light emitting device that has a high quality of semiconductor layer having less dislocation and that has a high level of luminous efficiency.

2. Description of the Related Art

A III group nitride-based compound is a direct transition type semiconductor whose stable phase is of a wurtzite structure and whose forbidden band width can be varied from 6.2 eV in case of AlN to 1.9 eV in case of InN. For this reason, attention has been drawn toward it as a material for light emitting device use that is available for the emission of a light from a visible shorter wavelength range to a near ultraviolet range. Under this circumstance, a gallium nitride-based semiconductor light emitting device that is comprised of a III group nitride-based compound has been being developed.

Of these III group nitride-based compounds, an AlGaInN-based compound that is expressed as the general formula of $Al_xGa_yIn_{1-x-y}N$ (where $1 \geq x \geq 0$, $1 \geq y \geq 0$, and $1 \geq x+y \geq 0$) has gone on being developed as a material for light emitting device and photo detector use for visible light because the wavelength of light that is emitted therefrom can be varied from ultraviolet rays to red color light rays. Especially, with it acting as a motive that there have been realized blue/green high luminance light emitting diodes each of that is based on using a gallium nitride (GaN)-based compound, further researches and studies on the material have been made. Also, since an AlGaN-based compound in which in the general formula above the variables x and y have been set as having a relation of x+y=1 is a semiconductor which is stable even at a high temperature of 500° C. or more, it has gone on being developed as a material for device use that is usable in a high-temperature environment, or is cooling unneeded.

Here, a general method that manufactures a semiconductor light emitting device using a III group nitride-based compound that is expressed as the general formula of $Al_xGa_yIn_{1-x-y}N$ is using a single crystal of sapphire as a crystal substrate, causing various GaN-based crystal layers to be epitaxially grown on that substrate via buffer layers, and using a desired one of the GaN-based crystal layers as a relevant luminous portion. The reason for adopting that method is that, of the compounds expressed as the general formula of $Al_xGa_yIn_{1-x-y}N$ (where $1 \geq x \geq 0$, $1 \geq y \geq 0$, and $1 \geq x+y \geq 0$), a material of GaN has extreme difficulty synthesize the bulk crystal.

However, the difference between the sapphire substrate and the GaN material in terms of lattice constant is as great as approximately 16 percent. The defect density in the layer that has been grown amounts even to $10^6$ to $10^9$ cm$^{-3}$. Within the GaN-based crystal layer that has been grown using that method, there exist with a high density the dislocations that are attributable to the non-alignment of lattices that occurs between the crystal layer and the sapphire substrate.

Namely, the sapphire substrate and GaN material are different in physical property, such as not only in lattice constant but also in thermal expansion coefficient. Therefore, the crystal defects that are called "the dislocations" occur in large number. The dislocations are inherited in the growth direction even when the GaN-based crystal has grown and the thickness of the layer has become increased. They then become a continuous portion of defects that is called "the dislocation line (through dislocation)" and it causes an impairment of the device propertu such as decreasing the life of the buleish purple laser.

The reason why the device operates even with such a high defect density is due to the nature, peculiar to the semiconductor made using a III group nitride-based compound, that the luminous efficiency does not largely decrease even if the defect density is high. However, for obtaining a high quality and high reliability of devices, decreasing the defect density is indispensable. As one method for decreasing the defect density there is the one that obtains a low-dislocation GaN-based crystal by using a mask layer (for example, see Japanese Patent Application Laid-Open No. 2000-91253.). According to this method, in the process of growing as a semiconductor layer the dislocation laterally flows if that layer has a thickness that is somewhat great. This results in that the semiconductor layer with lesser dislocations is formed.

Japanese Patent Application Laid-Open No. 2000-91253 is hereby incorporated by reference.

SUMMARY OF THE INVENTION

However, so long as causing GaN to grow using a sapphire substrate, the occurrence of dislocations is inevitable. Although using a mask layer causes the lateral flow of the dislocations, since this semiconductor layer collides with another one that has laterally grown from an adjacent region, perfect elimination of the dislocations is impossible. For this reason, developing a nitride compound-based semiconductor light emitting device, which stands on using a semiconductor layer formed with its dislocations less in quantity, and which has excellent property has hitherto been demanded. If a semiconductor layer that is less in quantity of dislocations is obtained, emitting light by the recombination in the active layer is enabled with a higher level of efficiency.

To solve the above-described problems, the first invention of this application provides a semiconductor light emitting device being a gallium nitride-based semiconductor light emitting device that is prepared by laminating a substrate, and at least a first conductivity type semiconductor layer, an active layer, and a second conductivity type semiconductor layer that are laminated on the substrate sequentially from a side of substrate in this order, wherein the first conductivity type semiconductor layer has a level difference portions in height in the lamination direction, and the dislocation density of the active layer that is laminated on a portion of the first conductivity type semiconductor layer that has the higher level is lower than that of the active layer that is laminated on a portion thereof that has the lower level.

In the semiconductor light emitting device of the first invention, using the active layer corresponding to the portion of the first conductivity type semiconductor layer having a lower dislocation density as the luminous portion enables highly efficient luminescence.

The second invention of this application provides a semiconductor light emitting device being a gallium nitride-based semiconductor light emitting device that is prepared by laminating a substrate, and at least a first conductivity type semiconductor layer, an active layer, and a second conductivity type semiconductor layer that are laminated on the substrate sequentially from a side of substrate in this order, wherein the first conductivity type semiconductor layer has a level difference portions in height in the lamination direction, and the dislocation density of the active layer that is laminated on the vicinity of center spot of a portion of the first conductivity type semiconductor layer that has the higher level is lower than that of the active layer that is laminated on the center spot of the portion thereof that has the higher level and a portion thereof that has the lower level.

In the semiconductor light emitting device of the second invention, using the active layer corresponding to the portion of the first conductivity type semiconductor layer having a lower dislocation density as the luminous portion enables highly efficient luminescence.

The third invention of this application provides a semiconductor light emitting device being a gallium nitride-based semiconductor light emitting device that is prepared by laminating a substrate, and at least a first conductivity type semiconductor layer, an active layer, and a second conductivity type semiconductor layer that are laminated on the substrate sequentially from a side of substrate in this order, wherein the first conductivity type semiconductor layer is flattened level difference portions which the first conductivity type semiconductor layer had in height in the lamination direction, and the dislocation density of the active layer that is laminated on a portion of the first conductivity type semiconductor layer that had the higher level before flattening is lower than that of the active layer that is laminated on a portion thereof that had the lower level before flattening.

In the semiconductor light emitting device of the third invention, using the active layer corresponding to the portion of the first conductivity type semiconductor layer having a lower dislocation density as the luminous portion enables highly efficient luminescence.

The fourth invention of this application provides a semiconductor light emitting device being a gallium nitride-based semiconductor light emitting device that is prepared by laminating a substrate, and at least a first conductivity type semiconductor layer, an active layer, and a second conductivity type semiconductor layer that are laminated on the substrate sequentially from a side of substrate in this order, wherein the first conductivity type semiconductor layer is flattened level difference portions which the first conductivity type layer had in height in the lamination direction, and the dislocation density of the active layer that is laminated on the vicinity of center spot of the portion of the first conductivity type semiconductor layer that had the higher level before the flattening is lower than that of the active layer that is laminated on the center spot of the portion thereof that had the higher level before the flattening and a portion thereof that had the lower level before the flattening.

In the semiconductor light emitting device of the fourth invention, using the active layer corresponding to the portion of the first conductivity type semiconductor layer having a lower dislocation density as the luminous portion enables highly efficient luminescence.

The fifth invention of this application provides a semiconductor light emitting device being a gallium nitride-based semiconductor light emitting device that is prepared by laminating a substrate, and at least a first conductivity type semiconductor layer, an active layer, and a second conductivity type semiconductor layer that are laminated on the substrate sequentially from a side of substrate in this order, wherein the first conductivity type semiconductor layer has a level difference portions in height in the lamination direction, and a electrode formed on the second conductivity type semiconductor layer is arranged to have narrowing of electric current at the active layer that is laminated on a portion of the first conductivity type semiconductor layer that has the higher level.

In the semiconductor light emitting device of the fifth invention, arranging the electrode to have narrowing of electric current at a portion whose dislocation density is low in the active layer enables highly efficient luminescence.

The sixth invention of this application provides a semiconductor light emitting device being a gallium nitride-based semiconductor light emitting device that is prepared by laminating a substrate, and at least a first conductivity type semiconductor layer, an active layer, and a second conductivity type semiconductor layer that are laminated on the substrate sequentially from a side of substrate in this order, wherein the first conductivity type semiconductor layer has a level difference portions in height in the lamination direction, and a electrode formed on the second conductivity type semiconductor layer is arranged to have narrowing of electric current at the active layer that is laminated on the vicinity of center spot of the portion of the first conductivity type semiconductor layer that has the higher level.

In the semiconductor light emitting device of the sixth invention, arranging the electrode to have narrowing of electric current at a portion whose dislocation density is low in the active layer enables highly efficient luminescence.

The seventh invention of this application provides a semiconductor light emitting device being a gallium nitride-based semiconductor light emitting device that is prepared by laminating a substrate, and at least a first conductivity type semiconductor layer, an active layer, and a second conductivity type semiconductor layer that are laminated on the substrate sequentially from a side of substrate in this order, wherein the first conductivity type semiconductor layer is flattened level difference portions which the first conductivity type layer had in height in the lamination direction, and a electrode formed on the second conductivity type semiconductor layer is arranged to have narrowing of electric current at the active layer that is laminated on a portion of the first conductivity type semiconductor layer that had the higher level.

In the semiconductor light emitting device of the seventh invention, arranging the electrode to have narrowing of electric current at a portion whose dislocation density is low in the active layer enables highly efficient luminescence.

The eighth invention of this application provides a semiconductor light emitting device being a gallium nitride-based semiconductor light emitting device that is prepared by laminating a substrate, and at least a first conductivity type semiconductor layer, an active layer, and a second conductivity type semiconductor layer that are laminated on the substrate sequentially from a side of substrate in this order, wherein the first conductivity type semiconductor layer is flattened level difference portions that the first conductivity type layer had in height in the lamination direction, and a electrode formed on the second conductivity type semiconductor layer is arranged to have narrowing of electric current at the active layer that is laminated on the vicinity of center spot of the portion of the first conductivity type semiconductor layer that had the higher level.

In the semiconductor light emitting device of the eighth invention, arranging the electrode to have narrowing of electric current at a portion whose dislocation density is low in the active layer enables highly efficient luminescence.

From first invention to eighth invention of this application also include a semiconductor light emitting device wherein, plural masks are provided on one surface that is perpendicular to the lamination direction and that is between the substrate and the first conductivity type semiconductor layer in the way that the masks are disposed spacing apart from one another; and there is arranged the portion, having the higher-in-level, of the first conductivity type semiconductor layer, on the isolating portion having wide width of these isolating portions, which to separate the masks.

In first invention to eighth invention of this application, there is also included a semiconductor light emitting device wherein, plural buffer portions each having a different width are provided on one surface that is perpendicular to the lamination direction and that is between the substrate and the first conductivity type semiconductor layer; and there is arranged the portion, having the higher level, of the first conductivity type semiconductor layer, on the buffer portion having wide width.

In first invention to eighth invention of this application, there is also included a semiconductor light emitting device wherein, a buffer layer having a level difference portion whose levels respectively have a greater height and smaller height in the lamination direction is provided on one surface that is perpendicular to the lamination direction and that is between the substrate and the first conductivity type semiconductor layer; and there is arranged a portion, having the higher level, of the first conductivity type semiconductor layer, on a portion of the buffer layer having the higher level.

In first invention to eighth invention of this application, there is also included a semiconductor light emitting device wherein, plural level difference portions the levels of each of that respectively have a greater height and smaller height in the direction that is perpendicular to the surface of the substrate, each level having a different width, are provided on the substrate; and of the portions of the substrate having the higher levels, on the one having the wide width there is disposed the portion of the first conductivity type semiconductor layer whose level is grater in height.

DESCRIPTION OF THE PREFERRED EMBODIMENTS

Figure 1A:
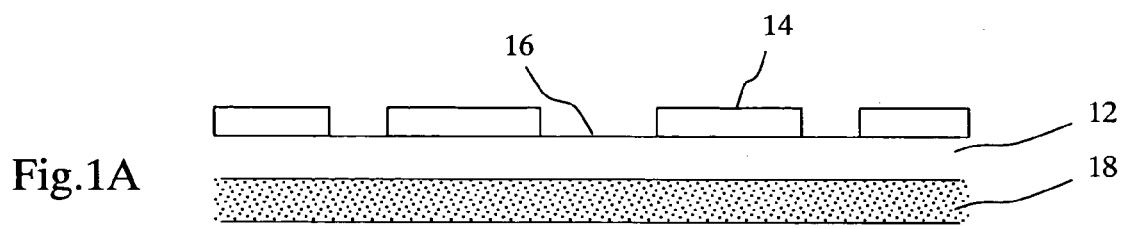
FIGS. 1A, 1B, 1C, 1D and 1E are views illustrating a manufacturing process for a gallium nitride-based semiconductor light emitting device according to the present invention.

Hereinafter, embodiments of the inventions of this application will be explained with reference to the drawings that are annexed hereto.

First Embodiment

FIGS. 1A, 1B, 1C, 1D and 1E are views illustrating a manufacturing process for a gallium nitride-based semiconductor light emitting device, according to the present invention, which is comprised of a III group nitride-based compound that is expressed as $Al_xGa_yIn_{1-x-y}N$ (where $1 \geq x \geq 0$, $1 \geq y \geq 0$, and $1 \geq x+y \geq 0$). From FIG. 1A to FIG. 1E represent the sequential order of the manufacturing process steps for a gallium nitride-based semiconductor light emitting device. In FIGS. 1A to FIG. 1E, a reference numeral 12 denotes a buffer layer, a reference numeral 14 denotes a mask, a reference numeral 16 denotes an isolation portion whose width is greater, a reference numeral 18 denotes a substrate, a reference numeral 22 denotes an active layer, a reference numeral 24 denotes an epitaxial selected longitudinal overgrowth portion, and a reference numeral 26 denotes an epitaxial selected lateral overgrowth portion, a reference numeral 27 denotes a first conductivity type semiconductor layer, a reference numeral 28 denotes a light emitting (luminous) portion, a reference numeral 29 denotes a dislocation line that grows at the time of epitaxial selected longitudinal overgrowth, and a reference numeral 30 denotes a dislocation line that is produced by colliding with an adjacent epitaxial selected lateral overgrowth portion.

In FIGS. 1A through 1E, there are illustrated process steps of forming the first conductivity type semiconductor layer 27 on the plural isolating portions 16 and plural masks 14 by epitaxial growth. The wording "epitaxial growth" refers to causing a semiconductor layer to grow on a crystal substrate, which serves as a base therefor, as a thin film crystal having the same crystal structure, and the same crystalline orientation, as the substrate. For producing a single crystal, there is a method that causes the growth of bulk crystal from a molten liquid. However, because a material of GaN is very high in melting point and, in addition, the equilibrium vapor pressure of nitrogen is also very high, the GaN compound has difficulty grow with that method. For this reason, for causing the crystal growth of the GaN, it becomes necessary to utilize a process of causing the epitaxial growth.

Roughly classifying the processes of growing a semiconductor mixed crystal, there are liquid phase epitaxy, vapor phase epitaxy, and molecular beam epitaxy. The liquid phase epitaxy is a method of growing crystal that causes the progressive growth thereof in such a way that, while a state of equilibrium is kept as is between the solid and the liquid phase, it causes the precipitation of crystal from the supersaturated solution. The vapor phase epitaxy is a method of growing crystal that while causing the flow of raw-material gas causes the growth of crystal under from several Torrs to the atmospheric pressure. The molecular beam epitaxy (MBE) is a method of growing crystal that causes the progressive growth thereof in such a way that the molecules or atoms of the elements composing the grown crystal come over to the substrate through a ultrahigh vacuumed space and the molecules or atoms become molecular beams with almost no collision occurring between them to reach the substrate.

In these processes for epitaxial growth, there are also excellent ones such as, especially, Hydride Vapor Phase Epitaxy (HVPE process), molecular beam epitaxy (MBE process), or metalorganic chemical vapor deposition (MOCVD process). The processes for epitaxial growth that are used in this embodiment of the present invention may be any one, or ones, of the above described various processes for the growth of crystal.

The epitaxial selected longitudinal overgrowth, or epitaxial selected lateral overgrowth (ELO: Epitaxial Lateral Overgrowth), that is explained in this application also falls under the category of "epitaxial growth". Either the epitaxial selected longitudinal overgrowth or the epitaxial selected lateral overgrowth can be selected by adjusting the growth temperature of a gallium nitride-based semiconductor, or the pressure or the growth temperature, within a chamber for growing a gallium nitride-based semiconductor.

A manufacturing process for a gallium nitride-based semiconductor light emitting device will now be explained. On the upper surface of the substrate 18, the buffer layer 12 that consists of GaN is laminated and, further, a mask layer that becomes the mask is laminated over the resulting mass. Using a mask patterning technique, the mask 14 is formed from the mask layer. Regarding part of the plural masks 14, there is used a method of making larger the spacing between adjacent two masks of that part than that between each adjacent two masks of the rest. By performing that method, of the isolating portions for separating the masks 14 from one another, there is formed the isolating portion 16 whose width is greater (FIG. 1A).

As a material that composes this substrate 18, it is possible to apply sapphire, SiC or the like. As a material for the buffer layer 12, it is possible to apply a III group nitride-based compound that is expressed as $Al_xGa_yIn_{1-x-y}N$ (where $1 \geq x \geq 0$, $1 \geq y \geq 0$, and $1 \geq x+y \geq 0$).

Also, as a material for the mask layer, it is possible to apply, for example, $SiO_2$ or SiN. Regarding the formation of the mask layer, first, $SiO_2$ or SiN is formed on the surface of the buffer layer 12 by using, for example, a process of sputtering, CVD, deposition or the like. Further a resist film is coated onto the resulting mass and then patterning is performed using photolithography and wet etching, to thereby form the mask layer. When performing this patterning, the pattern of the mask 14 may be formed into the shape of a stripe (the shape that has been slenderized). Also, the pattern of the mask 14 is not limited to being a stripe-like one and may be of any given shape. For example, it may be like a grating or the mask may be the one that has a prescribed shape, such as a circular one, as that of the isolating portion.

Figure 1B:
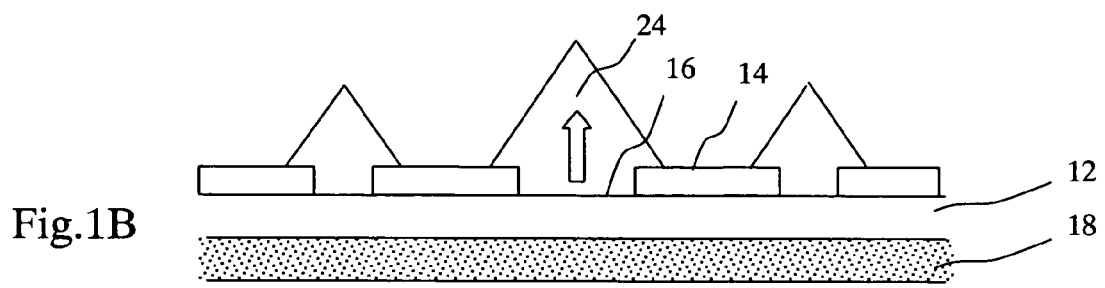

Next, on the portions where the buffer layer 12 is exposed from the mask 14, epitaxial selected longitudinal overgrowth of gallium nitride-based semiconductor that is comprised of a III group nitride-based compound is caused to occur. By doing so, on the isolating portion 16 there is formed the epitaxial selected longitudinal overgrowth portion 24 whose height is greater than that of each of the other isolating portions (FIG. 1B).

Figure 1C:
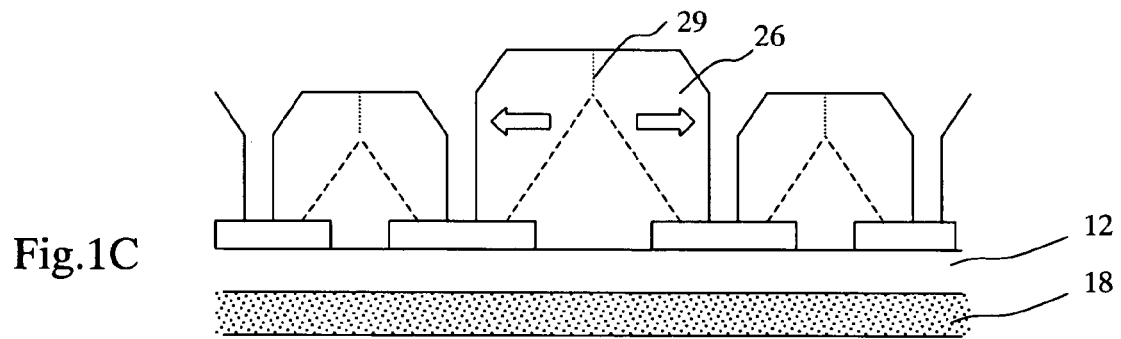
Figure 1D:
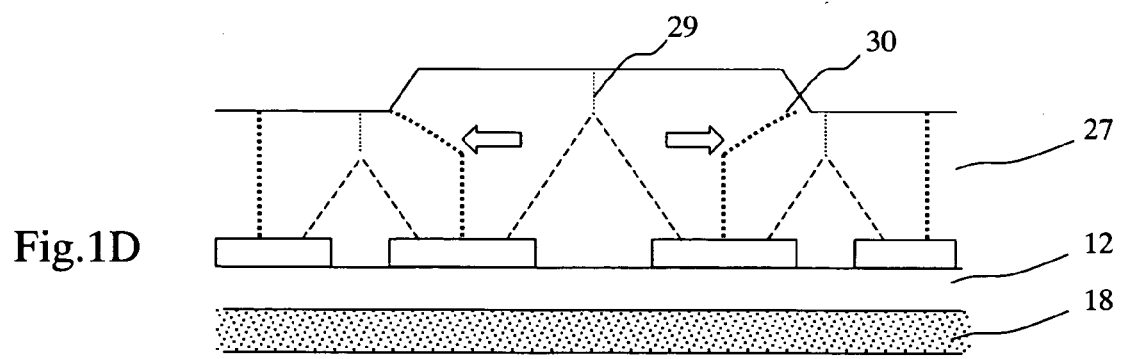
Figure 1E:
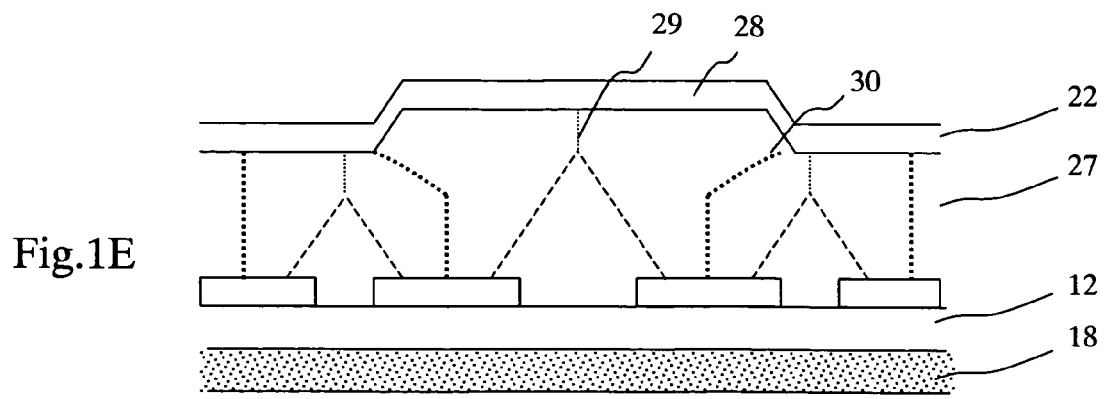

Further, epitaxial selected lateral overgrowth of a gallium nitride-based semiconductor that is comprised of a III group nitride-based compound is caused to occur from the epitaxial selected longitudinal overgrowth portion 24 (FIG. 1C). When causing the occurrence of that epitaxial selected lateral overgrowth, it collides with an epitaxial selected lateral overgrowth portion that is adjacent thereto and is coupled thereto. It results in forming the first conductivity type semiconductor layer 27 (FIG. 1D). As a result of this, over the isolating portion 16 there is formed a portion of the first conductivity type semiconductor layer 27 that is comprised of a III group nitride-based compound and that has a higher level of the level difference portion.

The portion of epitaxial selected lateral overgrowth grows from the III group nitride-based compound that acting as a nucleus, so the dislocation that occurs between the portion and the sapphire substrate is lesser in amount. Therefore, a good quality of semiconductor layer is obtained. Especially, the portion, having the greater height in terms of level difference portion, of the first conductivity type semiconductor layer 27 has no colliding portion with another epitaxial selected lateral overgrowth portion when the higher-in-level portion grows occurs. The dislocation, also, that occurs due to the collision becomes less.

However the dislocation line 29 that is produced by the epitaxial selected longitudinal overgrowth slightly grows (FIG. 1D). Thereby, the portion, except the center spot, having the greater height in terms of level difference portion of the first conductivity type semiconductor layer 27, has no colliding portion with another epitaxial selected lateral overgrowth portion when the higher-in-level portion grows occurs. For that reason, the dislocation that occurs due to the collision becomes less and there is no dislocation that occurs due to the eptaxial selected longtitudial overgrowth.

Next, on the upper surface of the first conductivity type semiconductor layer 27 there are sequentially laminated the active layer 22 that is comprised of a III group nitride-based compound and a second conductivity type semiconductor layer (not illustrated) that is comprised of a III group nitride-based compound (FIG. 1E), in this order.

When manufacturing a gallium nitride-based semiconductor light emitting device that is comprised of a III group nitride-based compound through executing the above-described process steps, the portion having, the higher level of the level difference portion is disposed at the first conductivity type semiconductor layer 27 that is located on the isolating portion 16 whose width is greater. And, the dislocation density of the active layer 22 that is formed on the portion of the first conductivity type semiconductor layer that has the higher level in terms of the level difference portion is lower than that of the active layer 22 that is formed on the portion of the first conductivity type semiconductor layer that has the lower level. Thereby, a gallium nitride-based semiconductor light emitting device whose structure is like that is obtained.

Furthermore, except the active layer that is formed on the center spot of the portion of the first conductivity type semiconductor layer 27 that has the higher level in terms of the level difference portion, the dislocation density of the active layer 22 that is formed on the portion of the first conductivity type semiconductor layer that has the higher level in terms of the level difference portion is lower than that of the active layer 22 that is formed on the portion of the first conductivity type semiconductor layer that has the lower level. Thereby, a gallium nitride-based semiconductor light emitting device whose structure is like that is obtained.

Accordingly, the gallium nitride-based semiconductor light emitting device that is obtained is as follows. Plural masks are provided on one surface that is perpendicular to the lamination direction and that is between the substrate and the first conductivity type semiconductor layer in the way that the masks are disposed in a state of their being spaced apart from each other. The first conductivity type semiconductor layer has a level difference portion the levels of which have a spacing therebetween in the lamination direction, one level being higher and the other level being lower. And, on the isolating portion whose width is greater there is disposed the portion, having the higher level, of the first conductivity type semiconductor layer. And, the dislocation density of the active layer that is formed on the portion of the first conductivity type semiconductor layer that has the higher level is lower than that of the active layer that is formed on the portion of the first conductivity type semiconductor layer that has the lower level.

Furthermore, the gallium nitride-based semiconductor light emitting device wherein the dislocation density of the active layer that is laminated on the vicinity of center spot of the portion of the first conductivity type semiconductor layer that has the higher level is lower than that of the active layer that is laminated on the center spot of the portion of the first conductivity type semiconductor layer that has the higher level and a portion of the first conductivity type semiconductor layer that has the lower level is obtained.

Using the active layer 22 where the dislocation density is low as the luminous portion 28 enables making the gallium nitride-based semiconductor light emitting device the one whose luminous efficiency is high.

Here, the contents of the term "center spot of a portion of the first conductivity type semiconductor layer that has the higher level in terms of the level difference portion" will be explained. In FIG. 1B, in the case when the pattern of masks 14 has stripe shape, since the center spot of the portion of the first conductivity type semiconductor layer that has the higher level in terms of the level difference portion is corresponding to the ridge of the epitaxial selected longitudinal overgrowth portion 24 whose shape is like range, the center spot of the portion of the first conductivity type semiconductor layer that has the higher level in terms of the level difference portion forms a line in FIG. 1E. In the case when the pattern of masks 14 has shape of lattice or circular form as the isolating portions, since the center spot of the portion of the first conductivity type semiconductor layer that has the higher level in terms of the level difference portion is corresponding to the top of square pyramid or circular cone, the center spot of the portion of the first conductivity type semiconductor layer that has the higher level in terms of the level difference portion forms a point in FIG. 1E. In the same way in the following embodiments, "center spot of a portion of the first conductivity type semiconductor layer that has the higher level in terms of the level difference portion" forms a line or point, according to the shape of masks or shape of the epitaxial selected longitudinal overgrowth portion.

Figure 9A:
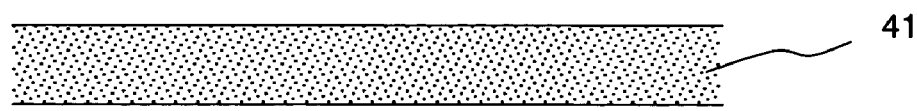
FIGS. 9A, 9B, and 9C are views illustrating a thing that is generally called "the substrate".
Figure 9B:
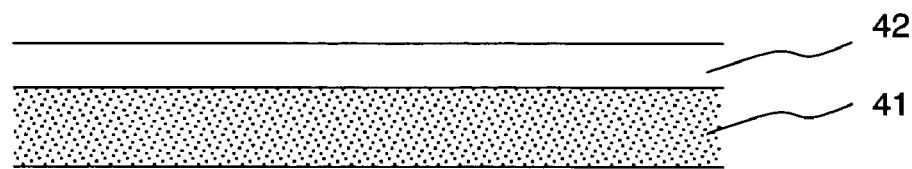
Figure 9C:
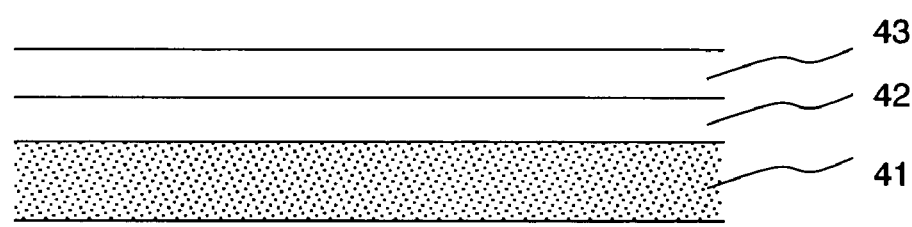

Here, the contents of the term "substrate" will be explained. In general, when referring to the "substrate", it is also thought that that term has multiple meanings. Therefore, the sense of the "substrate" in a case where it is used in this application will be made clear, here. Reference is made, here, to FIGS. 9A to 9C. FIGS. 9A to 9C illustrate ones that are made of what is generally called "the substrate". In these FIGS., a reference numeral 41 denotes sapphire, a reference numeral 42 denotes a buffer layer, and a reference numeral 43 denotes a GaN layer. FIG. 9A illustrates the "substrate" that is so referred to in this application. In FIG. 9A, the sapphire 41 is illustrated, as an example, among the illustrated examples that have been referred to above. FIG. 9B illustrates the sapphire substrate that has provided thereon the buffer layer 42. It also sometimes happens that this 2-layer structure as a whole is called "the substrate" in the general sense. Also, FIG. 9C illustrates a substrate that has been prepared by further providing the GaN layer 43, which is, in this case, thin, on the structure of FIG. 9B. It also sometimes happens that this 3-layer structure as a whole is called "the substrate" in the general sense.

As mentioned above, when the "substrate" is simply so referred to in general, it happens that the 2-layer structure or 3-layer structure, illustrated in FIG. 9B or 9C, as a whole, is referred to as the "substrate". However, it is defined, here in this application, that the "substrate" referred to therein means only the substrate that is illustrated in FIG. 9A. Namely, meaning that the structures such as those illustrated in FIGS. 6B and 6C that the buffer layer 42 and GaN layer 43 have been formed on the sapphire substrate 41, are not included under the category of "substrate".

As the material of the substrate, there can be used sapphire, SiC or the like. The reason why using sapphire or SiC is in view of the fact that using a GaN substrate is difficult, since the dissociation pressure of nitrogen is high and therefore GaN has the difficulty of being bulk crystal-grown. If the substrate is the one that consists of material that is different from GaN, material therefor is not limited to being sapphire and SiC. Also, in a case where using a sapphire substrate as the substrate, the principal surface thereof may be a C, R, or A surface.

Here, although, ordinarily, it is surely not impossible to form bulk crystal of GaN with respect to the sapphire substrate as is, in a case where difficult, for forming the first conductivity type semiconductor layer, it is necessary to perform relevant processing with respect to the substrate.

Those processing for forming the first conductivity type semiconductor layer that are performed with respect to the substrate include, for example, forming on the surface of the substrate that is made of sapphire, using a growth-at-low-temperature technique, a GaN layer having the thickness of several micro-meters (μm), and forming, after forming an AlGaN layer having the thickness of several tens of nano-meters (nm), a GaN layer having the thickness of several micro-meters (μm) using a growth-at-low-temperature technique. Namely, when making the substrate into a state that is illustrated in FIG. 9B or 9C, it becomes easier to form a semiconductor layer.

In this application, the structures illustrated in FIGS. 9B and 9C do not mean "substrate" itself. They should be grasped as being a substrate with respect to that processing for forming a semiconductor layer have been executed.

Incidentally, regarding the buffer layer, if there exist a layer, or layers, between the "substrate" referred to in this application and the mask layer or semiconductor layer, every one of those layers can be grasped as being a buffer layer. As already stated before, those layers may be formed each using a material of GaN.

Also, in this application, even in a case where there is illustrated a state where a semiconductor layer is formed directly on the substrate, this of course does not abate a technical mode in which processing for forming such semiconductor layer are executed with respect to the substrate.

Second Embodiment

FIGS. 2A, 2B, 2C, 2D and 2E are views illustrating another manufacturing process for a gallium nitride-based semiconductor light emitting device, according to the present invention, which is comprised of a III group nitride-based compound that is expressed as $Al_xGa_yIn_{1-x-y}N$ (where $1 \geq x \geq 0$, $1 \geq y \geq 0$, and $1 \geq x+y \geq 0$). In FIG. 2A to FIG. 2E, a reference numeral 12 denotes a buffer layer, a reference numeral 14 denotes a mask, a reference numeral 17 denotes a buffer layer that has been selected, a reference numeral 18 denotes a substrate, a reference numeral 22 denotes an active layer, a reference numeral 24 denotes an epitaxial selected longitudinal overgrowth portion, a reference numeral 27 denotes a first conductivity type semiconductor layer, a reference numeral 28 denotes a light emitting (luminous) portion, a reference numeral 29 denotes a dislocation line that grows at the time of epitaxial selected longitudinal overgrowth, and a reference numeral 30 denotes a dislocation line that is produced by colliding with an adjacent epitaxial selected lateral overgrowth portion.

Figure 2A:
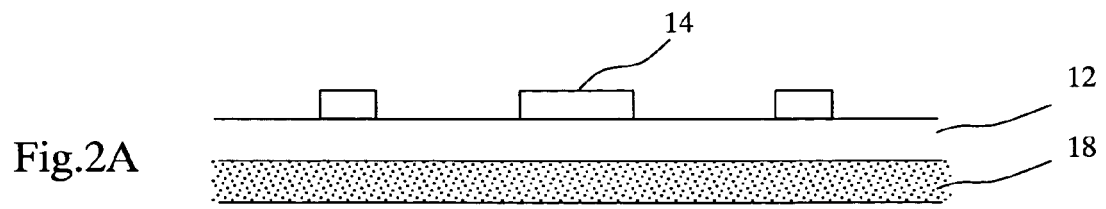
FIGS. 2A, 2B, 2C, 2D and 2E are views illustrating another manufacturing process for a gallium nitride-based semiconductor light emitting device according to the present invention.

On the upper surface of the substrate 18, the buffer layer 12 that consists of GaN is laminated and, further, a mask layer that becomes the mask is laminated over the resulting mass. The mask 14 is formed from the mask layer using a mask patterning technique (FIG. 2A). Regarding part of the plural masks 14, the masks are formed in the way that they become greater in width than the rest.

As a material that composes this substrate 18, it is possible to apply sapphire, SiC or the like. As a material for the buffer layer 12, it is possible to apply a III group nitride-based compound that is expressed as $Al_xGa_yIn_{1-x-y}N$ (where $1 \geq x \geq 0$, $1 \geq y \geq 0$, and $1 \geq x+y \geq 0$).

Also, as a material for the mask layer, it is possible to apply, for example, $SiO_2$ or SiN. Regarding the formation of the mask layer, first, $SiO_2$ or SiN is formed on the surface of the buffer layer 12 by using, for example, a process of sputtering, CVD, deposition or the like. Further, a resist film is coated onto the resulting mass and then patterning is performed using photolithography and wet etching, to thereby form the mask layer. When performing this patterning, the pattern of the mask 14 may be formed into the shape of a stripe (the shape that has been slenderized). Also, the pattern of the mask 14 is not limited to being a stripe-like one and may be of any given shape. For example, it may be like a grating or the mask may be the one that has a prescribed shape, such as a circular one.

Figure 2B:
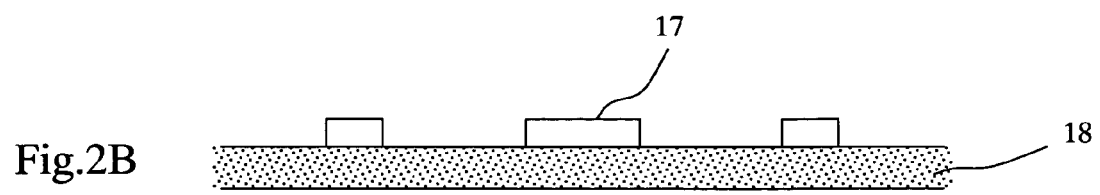

Next, when etching the buffer layer 12 that is not covered by the mask 14 and then eliminating the mask 14, the buffer layers 17 that have been selected remain (FIG. 2B).

Figure 2C:
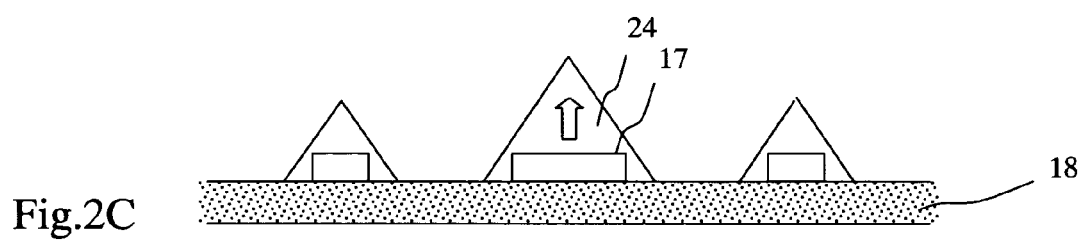

Using as the nuclei the buffer layers 17 that have been selected, epitaxial selected longitudinal overgrowth of gallium nitride-based semiconductor that is comprised of a III group nitride-based compound is caused to occur. By doing so, on the buffer layer 17 having a greater width, of the buffer layers that have been selected, there is formed the portion of epitaxial selected longitudinal overgrowth 24 whose height is greater than that of each of the remaining portions thereof (FIG. 2C).

Figure 2D:
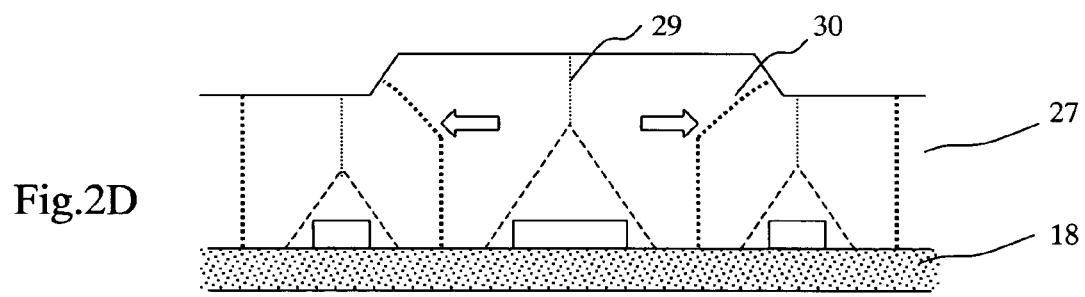
Figure 2E:
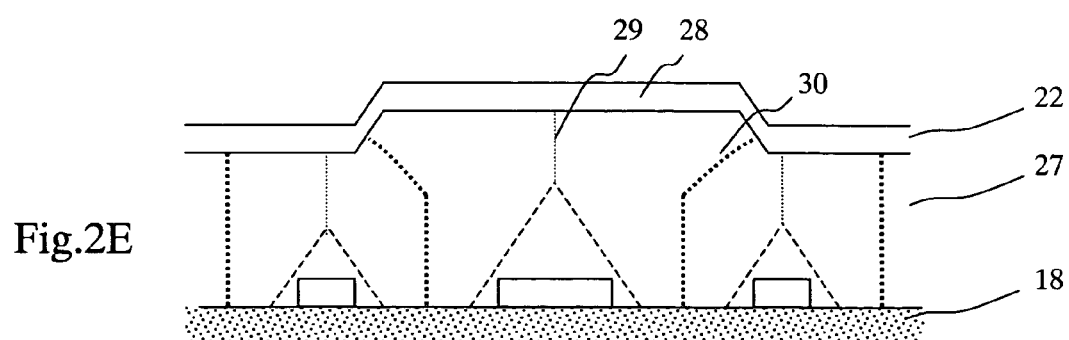

Next, epitaxial selected lateral overgrowth of a gallium nitride-based semiconductor that is comprised of a III group nitride-based compound is caused to occur from the portion of epitaxial selected longitudinal overgrowth 24. When doing so, that semiconductor collides with an epitaxial selected lateral overgrowth portion that is adjacent thereto and is coupled thereto. It results in forming the first conductivity type semiconductor layer 27 (FIG. 2D). As a result of this, over the buffer layer whose width is greater there is formed a portion having the higher level of the level different portion of the first conductivity type semiconductor layer 27 that is comprised of a III group nitride-based compound.

The portion of epitaxial selected lateral overgrowth grows from the III group nitride-based compound that acts as a nucleus, so the dislocation that occurs between the portion and the sapphire substrate is lesser in amount. Therefore, a good quality of semiconductor layer is obtained. Especially, the portion, having the greater height in terms of level difference portion, of the first conductivity type semiconductor layer 27 has no colliding portion with another epitaxial selected lateral overgrowth portion that when that higher-in-level portion grows occurs. The dislocation, also, that occurs due to the collision becomes less.

However the dislocation line 29 that is produced by the epitaxial selected longitudial overgrowth slightly grows (FIG. 2D). Thereby, the portion, except the center spot, having the greater height in terms of level difference portion of the first conductivity type semiconductor layer 27, has no colliding portion with another epitaxial selected lateral overgrowth portion when the higher-in-level portion grows occurs. For that reason, the dislocation that occurs due to the collision becomes less and there is no dislocation that occurs due to the eptaxial selected longtitudial overgrowth.

Further, on the upper surface of the first conductivity type semiconductor layer 27 there are sequentially laminated the active layer 22 that is comprised of a III group nitride-based compound and a second conductivity type semiconductor layer (not illustrated) that is comprised of a III group nitride-based compound (FIG. 2E), in this order.

When manufacturing a gallium nitride-based semiconductor light emitting device that is comprised of a III group nitride-based compound through executing the above-described process steps, the portion having the higher level of the level difference portion is disposed at the first conductivity type semiconductor layer 27 that is located on the buffer layer 17 whose width is greater. And, the dislocation density of the active layer 22 that is formed on the portion of the first conductivity type semiconductor layer that has the higher level in terms of level difference portion is lower than that of the active layer 22 that is formed on the portion of the first conductivity type semiconductor layer that has the lower level. Thereby, a gallium nitride-based semiconductor light emitting device whose structure is like that is obtained.

Furthermore, except the active layer that is formed on the center spot of the portion of the first conductivity type semiconductor layer 27 that has the higher level in terms of the level difference portion, the dislocation density of the active layer 22 that is formed on the portion of the first conductivity type semiconductor layer that has the higher level in terms of the level difference portion is lower than that of the active layer 22 that is formed on the portion of the first conductivity type semiconductor layer that has the lower level. Thereby, a gallium nitride-based semiconductor light emitting device whose structure is like that is obtained.

Accordingly, the gallium nitride-based semiconductor light emitting device that is obtained is as follows. Plural buffer portions the width of each of that is different are provided on one surface that is perpendicular to the lamination direction and that is between the substrate and the first conductivity type semiconductor layer. The first conductivity type semiconductor layer has a level difference portion in height in the lamination direction, one level being higher and the other level being lower. And, on the buffer portion whose width is greater there is disposed the portion, having the higher level, of the first conductivity type semiconductor layer. And, the dislocation density of the active layer that is formed on the portion of the first conductivity type semiconductor layer that has the higher level is lower than that of the active layer that is formed on the portion of the first conductivity type semiconductor layer that has the lower level.

Furthermore, the gallium nitride-based semiconductor light emitting device wherein the dislocation density of the active layer that is laminated on the vicinity of center spot of a portion of the first conductivity type semiconductor layer that has the higher level is lower than that of the active layer that is laminated on the center spot of the portion of the first conductivity type semiconductor layer that has the higher level and a portion of the first conductivity type semiconductor layer that has the lower level is obtained.

Using the active layer 22 where the dislocation density is low as the luminous portion 28 enables making the gallium nitride-based semiconductor light emitting device the one whose luminous efficiency is high.

Third Embodiment

FIGS. 3A, 3B, 3C, 3D and 3E are views illustrating another manufacturing process for a gallium nitride-based semiconductor light emitting device, according to the present invention, which is comprised of a III group nitride-based compound that is expressed as $Al_xGa_yIn_{1-x-y}N$ (where $1 \geq x \geq 0$, $1 \geq y \geq 0$, and $1 \geq x+y \geq 0$). In FIG. 3A to FIG. 3E, a reference numeral 12 denotes a buffer layer, a reference numeral 14 denotes a mask, a reference numeral 19 denotes a buffer layer the level difference portion of that has a higher height, a reference numeral 18 denotes a substrate, a reference numeral 22 denotes an active layer, a reference numeral 27 denotes a first conductivity type semiconductor layer, a reference numeral 28 denotes a light emitting (luminous) portion, a reference numeral 29 denotes a dislocation line that grows at the time of epitaxial selected longitudinal overgrowth, and a reference numeral 30 denotes a dislocation line that is produced by colliding with an adjacent epitaxial selected lateral overgrowth portion.

Figure 3A:
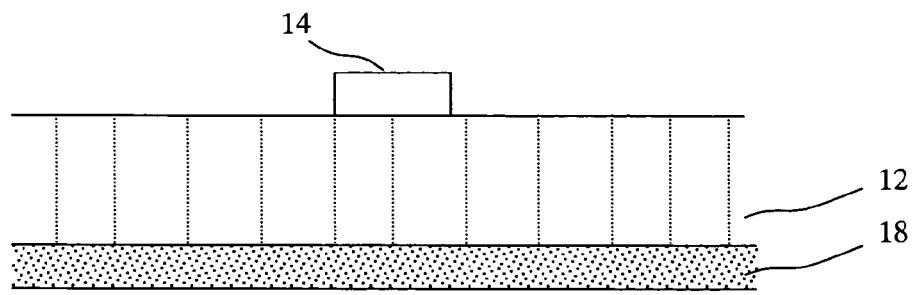
FIGS. 3A, 3B, 3C, 3D and 3E are views illustrating still another manufacturing process for a gallium nitride-based semiconductor light emitting device according to the present invention.
Figure 3B:
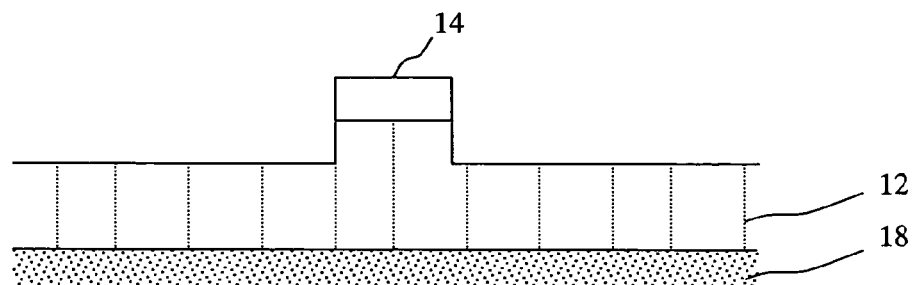

On the upper surface of the substrate 18, the buffer layer 12 that consists of GaN is laminated and, further, a mask layer that becomes the mask is laminated over the resulting mass. The mask 14 is formed from the mask layer using a mask patterning technique (FIG. 3A).

As a material that composes this substrate 18, it is possible to apply sapphire, SiC or the like. As a material for the buffer layer 12, it is possible to apply a III group nitride-based compound that is expressed as $Al_xGa_yIn_{1-x-y}N$ (where $1 \geq x \geq 0$, $1 \geq y \geq 0$, and $1 \geq x+y \geq 0$).

Also, as a material for the mask layer, it is possible to apply, for example, $SiO_2$ or SiN. Regarding the formation of the mask layer, first, $SiO_2$ or SiN is formed on the surface of the buffer layer 12 by using, for example, a process of sputtering, CVD, deposition or the like. Further, a resist film is coated onto the resulting mass and then patterning is performed using photolithography and wet etching, to thereby form the mask layer. When performing this patterning, the pattern of the mask 14 may be formed into the shape of a stripe (the shape that has been slenderized). Also, the pattern of the mask 14 is not limited to being a stripe-like one and may be of any given shape. For example, it may be like a grating or the mask may be the one that has a prescribed shape, such as a circular one.

Figure 3C:
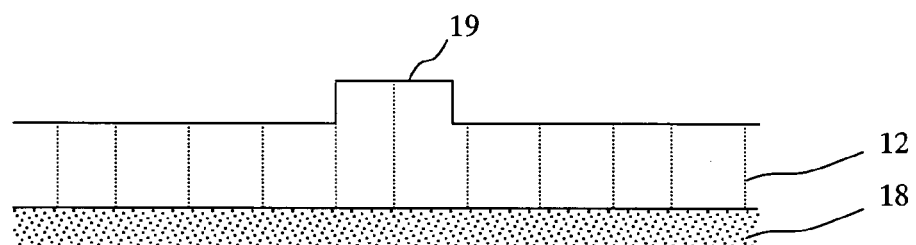

Next, when etching the buffer layer 12 that is not covered by the mask 14 (FIG. 3B) and then eliminating the mask 14, the buffer layer 19 that has a higher-in-level portion remains (FIG. 3C).

Here, the portion that has a higher-in-level portion is provided only one in number. However, no inconvenience arises even if, through patterning, plural buffer layers whose widths are different and each of whose level difference portions have a higher level are left as are and, among those plural buffer layers, there are used the ones whose widths are greater than those of the remaining ones.

Figure 3D:
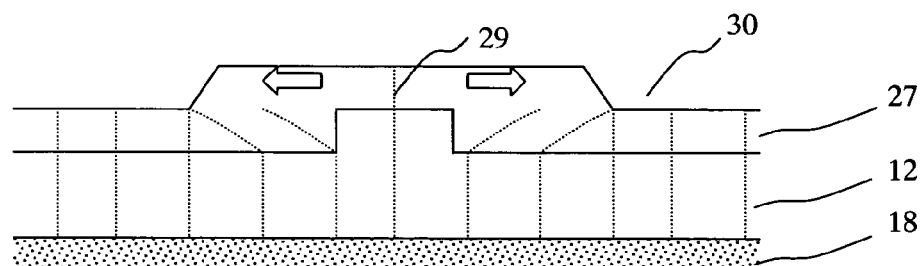
Figure 3E:
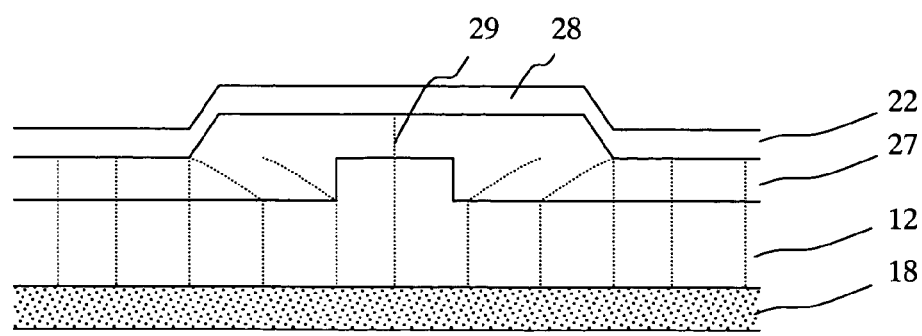

When epitaxial selected lateral overgrowth of a gallium nitride-based semiconductor that is comprised of a III group nitride-based compound is caused to occur by causing the buffer layer 19 whose level difference portion is higher to act as a nucleus, this results in forming the first conductivity type semiconductor layer 27 (FIG. 3D). At the first conductivity type semiconductor layer over the buffer layer whose level difference portion has a greater height is formed the portion whose level difference portion has a greater height.

The portion of epitaxial selected lateral overgrowth grows from the III group nitride-based compound that acts as a nucleus, so the dislocation that occurs between the portion and the sapphire substrate is lesser in amount. Therefore, a good quality of semiconductor layer is obtained. Especially, the portion, having the greater height in terms of level difference portion, of the first conductivity type semiconductor layer 27 has no colliding portion, with another epitaxial selected lateral overgrowth portion when the higher-in-level portion grows occurs. The dislocation, also, that occurs due to the collision becomes less.

However the dislocation line 29 that is produced by the epitaxial selected longitudial overgrowth slightly grows (FIG. 3D). Thereby, the portion, except the center spot, having the greater height in terms of level difference portion of the first conductivity type semiconductor layer 27, has no colliding portion with another epitaxial selected lateral overgrowth portion when the higher-in-level portion grows occurs. For that reason, the dislocation that occurs due to the collision becomes less and there is no dislocation that occurs due to the eptaxial selected longtitudial overgrowth.

Further, on the upper surface of the first conductivity type semiconductor layer 27 there are sequentially laminated the active layer 22 that is comprised of a III group nitride-based compound and a second conductivity type semiconductor layer (not illustrated) that is comprised of a III group nitride-based compound (FIG. 3E), in this order.

When manufacturing a gallium nitride-based semiconductor light emitting device that is comprised of a III group nitride-based compound through executing the above-described process steps, the portion having the higher level of the level difference portion is disposed at the first conductivity type semiconductor layer 27 that is located on the buffer layer 19 whose level difference portion has a greater. And, the dislocation density of the active layer 22 that is formed on the portion of the first conductivity type semiconductor layer that has the higher level in terms of level difference portion is lower than that of the active layer 22 that is formed on the portion of the first conductivity type semiconductor layer that has the lower level. Thereby, a gallium nitride-based semiconductor light emitting device whose structure is like that is obtained.

Furthermore, except the active layer that is formed on the center spot of the portion of the first conductivity type semiconductor layer 27 that has the higher level in terms of the level difference portion, the dislocation density of the active layer 22 that is formed on the portion of the first conductivity type semiconductor layer that has the higher level in terms of the level difference portion is lower than that of the active layer 22 that is formed on the portion of the first conductivity type semiconductor layer that has the lower level. Thereby, a gallium nitride-based semiconductor light emitting device whose structure is like that is obtained.

Accordingly, the gallium nitride-based semiconductor light emitting device that is obtained is as follows. Plural buffer portions the width of each of that is different are provided on one surface that is perpendicular to the lamination direction and that is between the substrate and the first conductivity type semiconductor layer. The first conductivity type semiconductor layer has a level difference portion in height in the lamination direction, one level being higher and the other level being lower. And, on the buffer portion whose width is greater there is disposed the portion, having the higher level, of the first conductivity type semiconductor layer. And, the dislocation density of the active layer that is formed on the portion of the first conductivity type semiconductor layer that has the higher level is lower than that of the active layer that is formed on the portion of the first conductivity type semiconductor layer that has the lower level.

Furthermore, the gallium nitride-based semiconductor light emitting device wherein the dislocation density of the active layer that is laminated on the vicinity of center spot of a portion of the first conductivity type semiconductor layer that has the higher level is lower than that of the active layer that is laminated on the center spot of the portion of the first conductivity type semiconductor layer that has the higher level and a portion of the first conductivity type semiconductor layer that has the lower level is obtained.

Using the active layer 22 where the dislocation density is low as the luminous portion 28 enables making the gallium nitride-based semiconductor light emitting device the one whose luminous efficiency is high.

Fourth Embodiment

FIGS. 4A, 4B, 4C, 4D and 4E are views illustrating another manufacturing process for a gallium nitride-based semiconductor light emitting device, according to the present invention, which is comprised of a III group nitride-based compound that is expressed as $Al_xGa_yIn_{1-x-y}N$ (where $1 \geq x \geq 0$, $1 \geq y \geq 0$, and $1 \geq x+y \geq 0$). In FIG. 4A to FIG. 4E, a reference numeral 13 denotes a buffer layer, a reference numeral 14 denotes a mask, a reference numeral 15 denotes a portion of the substrate having a greater width, of the portions thereof having a greater height in terms of level difference portion, a reference numeral 18 denotes a substrate, a reference numeral 22 denotes an active layer, a reference numeral 24 denotes an epitaxial selected longitudinal overgrowth portion, a reference numeral 27 denotes a first conductivity type semiconductor layer, a reference numeral 28 denotes a light emitting (luminous) portion, a reference numeral 29 denotes a dislocation line that grows at the time of epitaxial selected longitudinal overgrowth, and a reference numeral 30 denotes a dislocation line that is produced by colliding with an adjacent epitaxial selected lateral overgrowth portion.

Figure 4A:
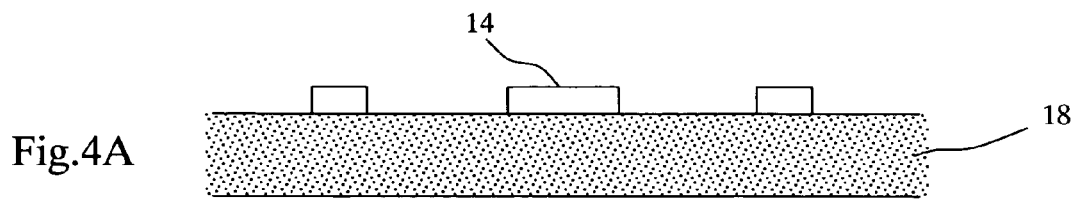
FIGS. 4A, 4B, 4C, 4D and 4E are views illustrating further manufacturing process for a gallium nitride-based semiconductor light emitting device according to the present invention.

On the upper surface of the substrate 18, a mask layer that becomes the mask is laminated. The mask 14 is formed from the mask layer using a mask patterning technique (FIG. 4A). Regarding part of the plural masks 14, the masks are formed in the way that they become greater in width than the rest.

As a material that composes the substrate 18, it is possible to apply sapphire, SiC or the like. Also, as a material for the mask layer 12, it is possible to apply, for example, $SiO_2$ or SiN. Regarding the formation of the mask layer, first, $SiO_2$ or SiN is formed on the surface of the substrate 18 by using, for example, a process of sputtering, CVD, deposition or the like. process. Further, a resist film is coated onto the resulting mass and then patterning is performed using, for example, photolithography and wet etching, to thereby form the mask layer. When performing this patterning, the pattern of the mask 14 may be formed into the shape of a stripe (the shape that has been slenderized). Also, the pattern of the mask 14 is not limited to being a stripe-like one and may be of any given shape. For example, it may be like a grating or the mask may be the one that has a prescribed shape, such as a circular one.

Figure 4B:
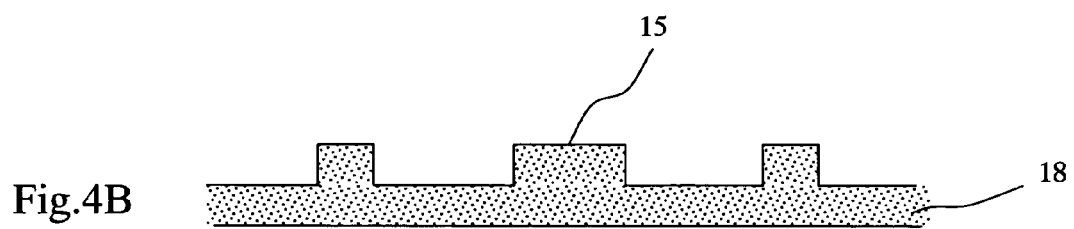

When etching the portions of the substrate 18 that are not covered by the mask 14 and then eliminating the mask 14, the portions of the substrate such that each of the portions has a higher-in-level portion and that include, of the portions of the substrate having the higher-in-level portion, the one 15 having a greater width, remain (FIG. 4B).

Figure 4C:
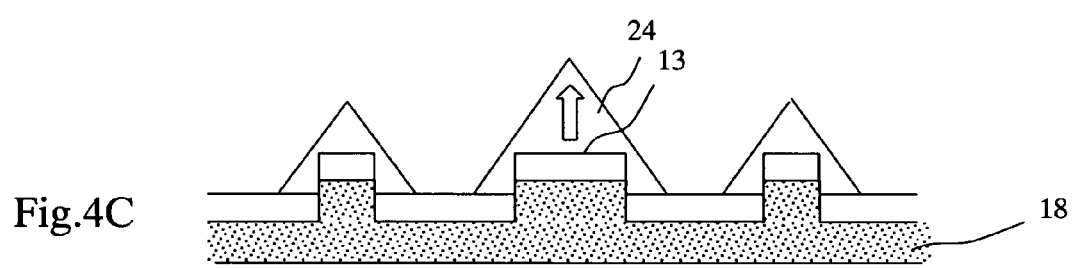

On the substrate 18 that includes, of the portions of the substrate having the greater height in terms of level difference portion, the one 15 having a greater width, a buffer layer that consists of GaN is laminated. A buffer layer 13 that is located on, of the portions of the substrate having the higher-in-level, the one 15 having a greater width becomes wider in width than the buffer layer that is located on the remaining portions of the substrate having the higher-in-level. Using as the nuclei the buffer layers that have the greater height in terms of level difference portion, epitaxial selected longitudinal overgrowth of gallium nitride-based semiconductor that is comprised of a III group nitride-based compound is caused to occur. By doing so, on the buffer layer 13 having a greater width, of the buffer layers that have the greater height, there is formed the portion of epitaxial selected longitudinal overgrowth portion 24 whose height is greater than that of each of the remaining portions thereof (FIG. 4C).

Figure 4D:
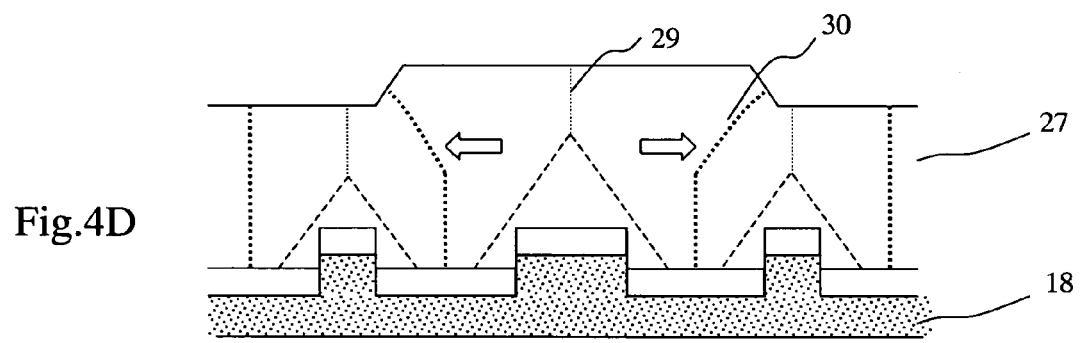

Next, when epitaxial selected lateral overgrowth of a gallium nitride-based semiconductor that is comprised of a III group nitride-based compound is caused to occur from the portion of epitaxial selected longitudinal overgrowth portion, that semiconductor is coupled to an epitaxial selected lateral overgrowth portion 24 that is adjacent thereto. It results in forming the first conductivity type semiconductor layer 27 that is comprised of a III group nitride-based compound (FIG. 4D). As a result of this, over the portions of the substrate, having the higher-in-level, whose width is greater there is formed a portion of the first conductivity type semiconductor layer 27 comprised of a III group nitride-based compound, whose level difference portion has a greater height in the lamination direction.

The portion of epitaxial selected lateral overgrowth grows from the III group nitride-based compound that acts as a nucleus, so the dislocation that occurs between the portion and the sapphire substrate is lesser in amount. Therefore, a good quality of semiconductor layer is obtained. Especially, the higher level portion of the first conductivity type semiconductor layer 27 has no colliding portion with another epitaxial selected lateral overgrowth portion when that higher level portion grows occurs. Thereby the dislocation of due to the collision becomes less in the higher level portion of the first conductivity type semiconductor layer 27. And also the big dislocation due to the collision with adjacent epitaxial selected longitudinal overgrowth portion becomes less.

However the dislocation line 29 that is produced by the epitaxial selected longitudial overgrowth slightly grows (FIG. 4D). Thereby, the portion, except the center spot, having the greater height in terms of level difference portion of the first conductivity type semiconductor layer 27, has no colliding portion with another epitaxial selected lateral overgrowth portion when the higher-in-level portion grows occurs. For that reason, the dislocation that occurs due to the collision becomes less and there is no dislocation that occurs due to the eptaxial selected longtitudial overgrowth.

Figure 4E:
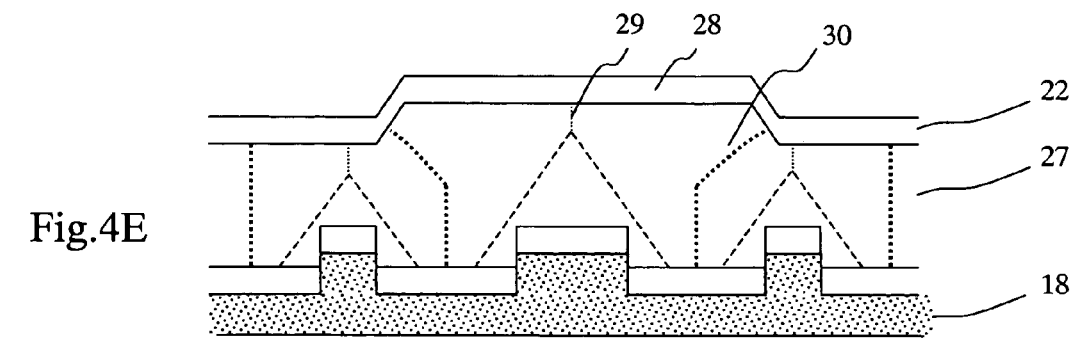

Further, on the upper surface of the first conductivity type semiconductor layer 27 there are sequentially laminated the active layer 22 that is comprised of a III group nitride-based compound and a second conductivity type semiconductor layer (not illustrated) that is comprised of a III group nitride-based compound in this order (FIG. 4E).

When manufacturing a gallium nitride-based semiconductor light emitting device that is comprised of a III group nitride-based compound through executing the above-described process steps, the portion having the higher level of the level difference portion is disposed at the first conductivity type semiconductor layer 27 that is located on the one 15, of the portions of the substrate having the greater height, whose width is greater. And, the dislocation density of the active layer that is formed on the portion of the first conductivity type semiconductor layer that has the higher level is lower than that of the active layer that is formed on the portion thereof that has the lower level. Thereby, a gallium nitride-based semiconductor light emitting device whose structure is like that is obtained.

Furthermore, except the active layer that is formed on the center spot of the portion of the first conductivity type semiconductor layer 27 that has the higher level in terms of the level difference portion, the dislocation density of the active layer 22 that is formed on the portion of the first conductivity type semiconductor layer that has the higher level in terms of the level difference portion is lower than that of the active layer 22 that is formed on the portion of the first conductivity type semiconductor layer that has the lower level. Thereby, a gallium nitride-based semiconductor light emitting device whose structure is like that is obtained.

Accordingly, the gallium nitride-based semiconductor light emitting device that is obtained is as follows. Plural level difference portions the width of each of that is different are provided on the substrate; and the first conductivity type semiconductor layer has a level difference portion in height in the lamination direction, one level being higher and the other level being lower. And, of the level difference portions of the substrate, each portions has the higher-in-level, whose width is greater there is disposed the portion, having the higher level, of the first conductivity type semiconductor layer. And, the dislocation density of the active layer that is formed on the portion of the first conductivity type semiconductor layer that has the higher level is lower than that of the active layer that is formed on the portion of first conductivity type semiconductor layer that has the lower level.

Furthermore, the gallium nitride-based semiconductor light emitting device wherein the dislocation density of the active layer that is laminated on the vicinity of center spot of a portion of the first conductivity type semiconductor layer that has the higher level is lower than that of the active layer that is laminated on the center spot of the portion of the first conductivity type semiconductor layer that has the higher level and a portion of the first conductivity type semiconductor layer that has the lower level is obtained.

Using the active layer 22 where the dislocation density is low as the luminous portion 28 enables making the gallium nitride-based semiconductor light emitting device the one whose luminous efficiency is high.

Fifth Embodiment

A semiconductor light emitting device according to this embodiment has an active layer on a first conductivity type semiconductor layer that is flattened level difference portions that the first conductivity type semiconductor layer had in height in the lamination direction. In the one of the embodiments from first to fourth, the first conductivity type semiconductor layer has level difference portions in height in the lamination direction and the first conductivity type semiconductor layer is flattened by growing the lower level portions thereof to have same level with the higher level portions and then the active layer is formed on the flattened semiconductor layer.

This embodiment will be explained with reference to the process steps of the first embodiment. FIGS. 5A, 5B, 5C, 5D and 5E are views illustrating a manufacturing process for a gallium nitride-based semiconductor light emitting device, according to the present invention, which is comprised of a III group nitride-based compound that is expressed as $Al_xGa_yIn_{1-x-y}N$ (where $1 \geq x \geq 0$, $1 \geq y \geq 0$, and $1 \geq x+y \geq 0$). From FIG. 5A to FIG. 5E represent the sequential order of the manufacturing process steps for a gallium nitride-based semiconductor light emitting device. In FIG. 5A to FIG. 5E, a reference numeral 12 denotes a buffer layer, a reference numeral 14 denotes a mask, a reference numeral 16 denotes an isolation portion whose width is greater, a reference numeral 18 denotes a substrate, a reference numeral 22 denotes an active layer, a reference numeral 24 denotes an epitaxial selected longitudinal overgrowth portion, a reference numeral 27 denotes a first conductivity type semiconductor layer, a reference numeral 28 denotes a light emitting (luminous) portion, a reference numeral 29 denotes a dislocation line that grows at the time of epitaxial selected longitudinal overgrowth, a reference numeral 30 denotes a dislocation line that is produced by colliding with an adjacent epitaxial selected lateral overgrowth portion and a reference numeral 31 denotes level difference portions that the first conductivity type semiconductor layer 27 had in height in the lamination direction.

A manufacturing process for a gallium nitride-based semiconductor light emitting device will now be explained. The manufacturing process steps shown in FIG. 1A to FIG. 1D that is described in the explanation of the first embodiment are followed by the process steps shown in FIG. 5A to FIG. 5D. In the manufacturing process steps according to FIG. 1A to FIG. 1D, the first conductivity type semiconductor layer has level difference portions in height in the lamination direction.

Figure 5A:
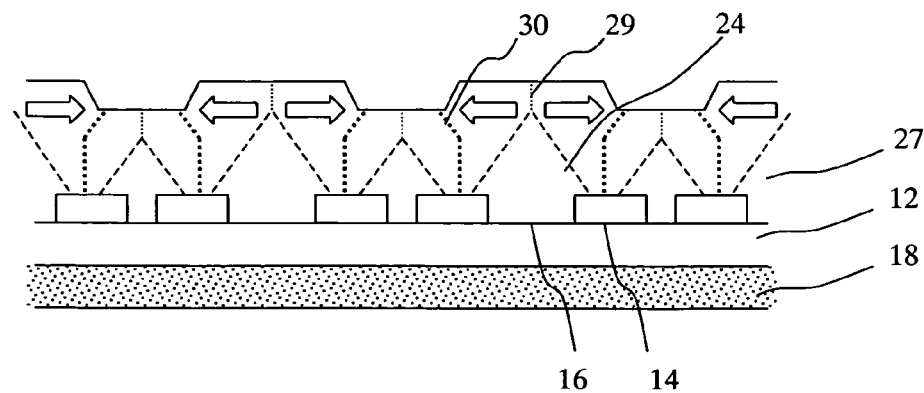
FIGS. 5A, 5B, 5C and 5D are views illustrating further manufacturing process for a gallium nitride-based semiconductor light emitting device according to the present invention.
Figure 5B:
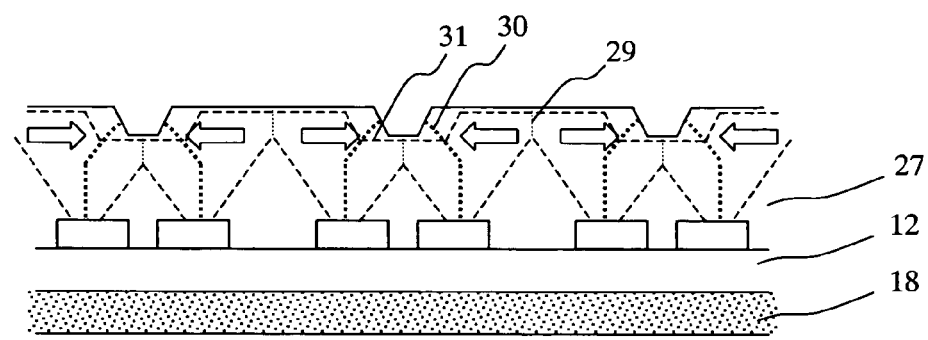

Epitaxial selected lateral overgrowth of a gallium nitride-based semiconductor that is comprised of a III group nitride-based compound is caused to occur from the epitaxial selected longitudinal overgrowth portion 24. When causing the occurrence of that epitaxial selected lateral overgrowth, it collides with an epitaxial selected lateral overgrowth portion that is adjacent thereto and is coupled thereto. It results in forming the first conductivity type semiconductor layer 27 (FIG. 5A). As a result of this, over the isolating portion 16 there is formed a portion of the first conductivity type semiconductor layer 27 that is comprised of a III group nitride-based compound and that has a higher level of the level difference portion (FIG. 5A).

Figure 5C:
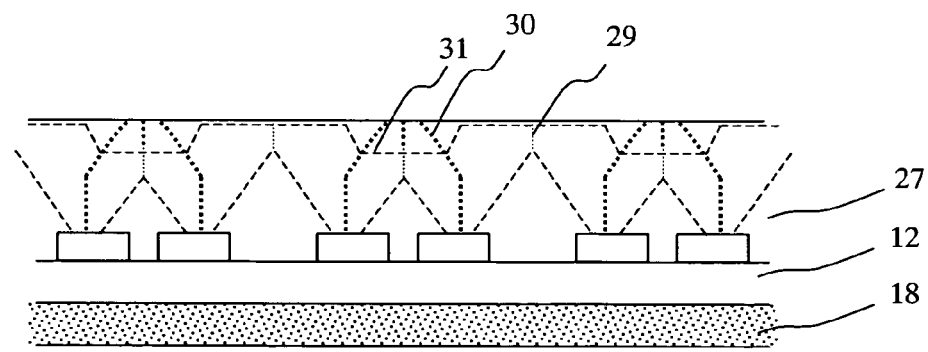
Figure 5D:
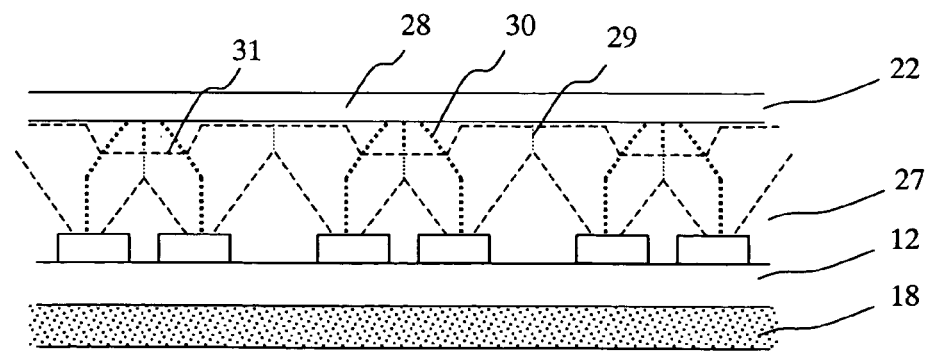

The portion of epitaxial selected lateral overgrowth grows from the III group nitride-based compound that acting as a nucleus, so the dislocation that occurs between the portion and the sapphire substrate is lesser in amount. Therefore, a good quality of semiconductor layer is obtained. Especially, the portion, having the greater height in terms of level difference portion, of the first conductivity type semiconductor layer 27 has no colliding portion with another epitaxial selected lateral overgrowth portion when the higher-in-level portion grows occurs. The dislocation, also, that occurs due to the collision becomes less. When causing the occurrence of further epitaxial selected lateral overgrowth from the higher level portions of the first conductivity type semiconductor layer (FIG. 5B), an upper surface of the first conductivity type semiconductor layer is flattened (FIG. 5C). In the same way, level difference portions 31 in height in the lamination direction are flattened.

However the dislocation line 29 that is produced by the epitaxial selected longitudial overgrowth slightly grows (FIG. 5C). Thereby, the portion, except the center spot, having the greater height in terms of level difference portion of the first conductivity type semiconductor layer 27, has no colliding portion with another epitaxial selected lateral overgrowth portion when the higher-in-level portion grows occurs. For that reason, the dislocation that occurs due to the collision becomes less and there is no dislocation that occurs due to the eptaxial selected longtitudial overgrowth.

Next, on the upper surface of the first conductivity type semiconductor layer 27 there are sequentially laminated the active layer 22 that is comprised of a III group nitride-based compound and a second conductivity type semiconductor layer (not illustrated) that is comprised of a III group nitride-based compound (FIG. 5D), in this order.

When manufacturing a gallium nitride-based semiconductor light emitting device that is comprised of a III group nitride-based compound through executing the above-described process steps, the portion having, the higher level of the level difference portion is disposed at the first conductivity type semiconductor layer 27 that is located on the isolating portion 16 whose width is greater. And, the dislocation density of the active layer 22 that is formed on the portion of the first conductivity type semiconductor layer that had the higher level in terms of the level difference portion is lower than that of the active layer 22 that is formed on the portion of the first conductivity type semiconductor layer that had the lower level. Thereby, a gallium nitride-based semiconductor light emitting device whose structure is like that is obtained.

Furthermore, the gallium nitride-based semiconductor light emitting device wherein the dislocation density of the active layer that is laminated on the vicinity of center spot of a portion of the first conductivity type semiconductor layer that had the higher level is lower than that of the active layer that is laminated on the center spot of the portion of the first conductivity type semiconductor layer that had the higher level and a portion of the first conductivity type semiconductor layer that had the lower level is obtained.

Using the active layer 22 where the dislocation density is low as the luminous portion 28 enables making the gallium nitride-based semiconductor light emitting device the one whose luminous efficiency is high.

In this embodiment, the first conductivity type semiconductor layer, that is comprised in the semiconductor light emitting device in the first embodiment wherein the masks are arranged, is flattened, and same applies to the semiconductor light emitting device in the second to fourth embodiments wherein the masks are arranged.

Sixth Embodiment

Figure 6:
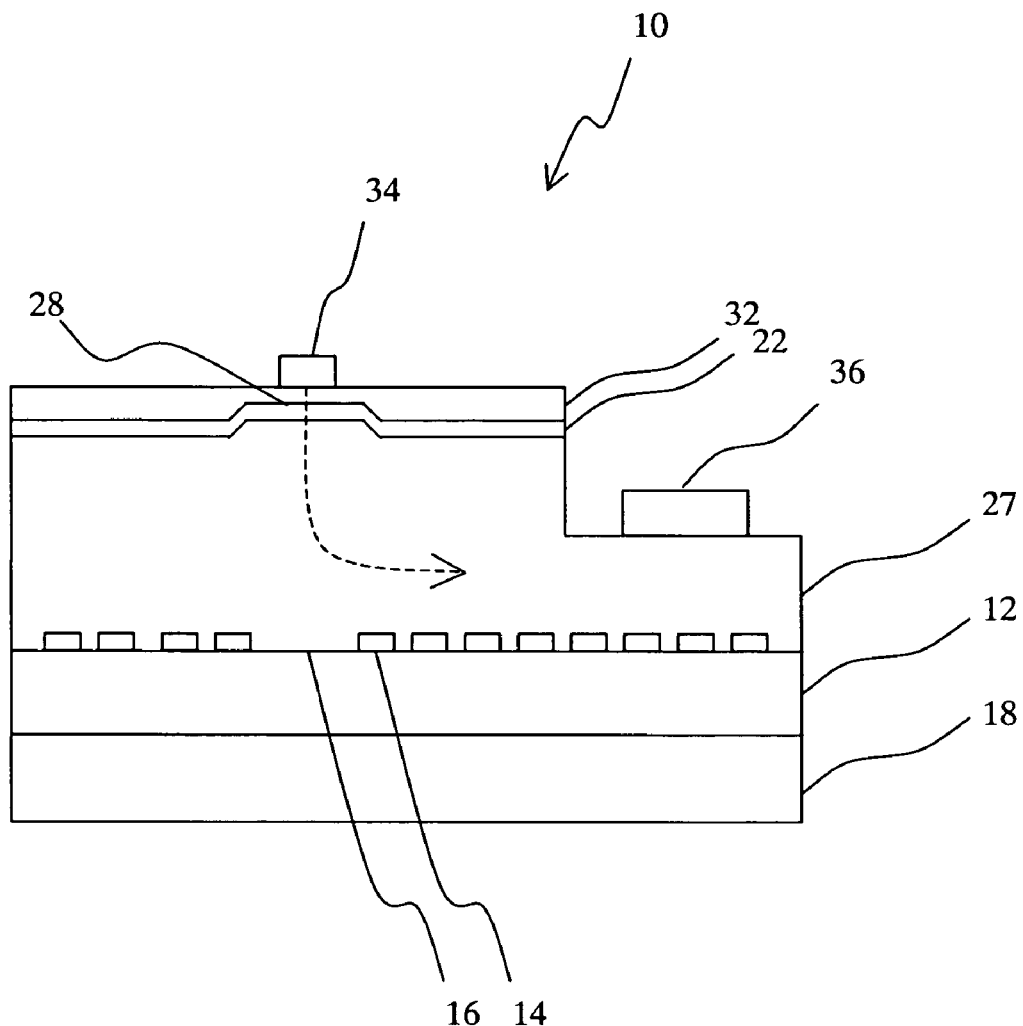
FIG. 6 is a view illustrating a gallium nitride-based semiconductor light emitting device according to the present invention.

FIG. 6 is a view illustrating an example of a gallium nitride-based semiconductor light emitting device, according to the present invention. FIG. 6 is a view that explains the structure of a gallium nitride-based semiconductor light emitting device. In FIG. 6, a reference numeral 12 denotes a buffer layer, a reference numeral 14 denotes a mask, a reference numeral 16 denotes an isolating portion, a reference numeral 18 denotes a substrate, a reference numeral 22 denotes an active layer, a reference numeral 27 denotes a first conductivity type semiconductor layer, a reference numeral 28 denotes a light emitting (luminous) portion, a reference numeral 32 denotes a second conductivity type semiconductor layer, a reference numeral 34 denotes a second electrode, and a reference numeral 36 denotes a first electrode.

In FIG. 6 there is illustrated a gallium nitride-based semiconductor light emitting device 10 which is comprised of a III group nitride-based compound that is expressed as $Al_xGa_yIn_{1-x-y}N$ (where $1 \geq x \geq 0$, $1 \geq y \geq 0$, and $1 \geq x+y \geq 0$). This device 10 includes the first conductivity type semiconductor layer 27 with respect to which processing for forming a level difference portion have been executed. Regarding the processing for forming this first conductivity type semiconductor layer having formed therein a level difference portion, the layer of course includes the ones which were explained in the above-described the first to fifth embodiments. Here, there is illustrated the first conductivity type semiconductor layer 27 involving therein a level difference portion, that was explained in the first embodiment.

The plural masks 14 are provided on the buffer layer 12 in such a way that they are spaced apart from one another and the portion of the first conductivity type semiconductor layer 27 that has the higher level of its level difference portion is disposed on the isolating portion 16 whose width is greater. Further, the above-described gallium nitride-based semiconductor light emitting device 10 may further include the active layer 22 that is formed on the first conductivity type semiconductor layer 27 and part of that is used as the luminous portion 28. In FIG. 6, the active layer 22 is provided in such a way that it is sandwiched between the first conductivity type semiconductor layer 27 and the second conductivity type semiconductor layer 32.

Here, for example, the first conductivity type semiconductor layer 27 is an n-type semiconductor (n-GaN) that has been constructed using GaN while the second conductivity type semiconductor layer 32 is a p-type semiconductor (p-GaN) that has been constructed using GaN. Each of the first conductivity type semiconductor layer 27 and second conductivity type semiconductor layer 32 is comprised of a III group nitride-based compound that is expressed as $Al_xGa_yIn_{1-x-y}N$ (where $1 \geq x \geq 0$, $1 \geq y \geq 0$, and $1 \geq x+y \geq 0$). It may be a mono-layer or multi-layer.

In that gallium nitride-based semiconductor light emitting device, the dislocation density of the active layer that is formed on the portion of the first conductivity type semiconductor layer that has the higher level in terms of level difference portion is lower than that of the active layer that is formed on the portion of first conductivity type semiconductor layer that has the lower level. Further, the dislocation density of the active layer that is formed on the portion of the first conductivity type semiconductor layer that had the higher level in terms of level difference portion is lower than that of the active layer that is formed on the portion of first conductivity type semiconductor layer that had the lower level. Arranging the second electrode 34 to have narrowing of electric current at a portion whose dislocation density is low in the active layer that is formed on the portion of the first conductivity type semiconductor layer that has/had higher level in terms of level difference portion enables to use the portion of the active layer whose dislocation density is low as the luminous portion. Using the portion where the dislocation density is low as the luminous portion 28 enables making the gallium nitride-based semiconductor light emitting device whose luminous efficiency is high.

Here, although the explanation has been given using GaN as an example, in the field of bluish purple semiconductor laser, a separate confinement type laser that uses AlGaN/GaN, or an InGaN laser that uses AlGaN/InGaN can also be realized. The active layer 22 is made of, for example, a compound that consists of GaInN but is not limited thereto. On the first conductivity type semiconductor layer 27 that consists of n-GaN there is formed the first electrode 36, while on the second conductivity type semiconductor layer 32 there is formed the second electrode 34. It is also an arbitrary matter of choice that a metal such as Al is used as the electrode and when performing deposition of that metal a contact layer (not illustrated) is provided.

The active layer 22 may be formed as having a structure that is arbitrary in kind, such as a bulk structure, a single quantum well structure or a multi-quantum well structure. In a case where adopting a single quantum well structure or multi-quantum well structure, it results that as the well layer that composes the single quantum well structure or multi-quantum well structure there is used a layer that is small in band gap and as the barrier layer there is used a layer that is large in band gap. For example, as the well layer, there can be used a layer that consists of material expressed as $In_{1-y}Ga_yN$ (where $0 \leq y \leq 1$), while, as the barrier layer, there can be used a layer that consists of material expressed as $Al_xGa_yN$ (where $x+y=1$).

In the process steps of forming the active layer 22, it may be constructed in the way that, for example, of the active layer 22, only a portion having the luminous portion 28 as its central region is left as is, namely, as a mesa shaped semiconductor light emitting device. And it may be constructed in the way that the narrowing of electric current is occurred at the active layer that is formed on the portion of the first conductivity type semiconductor layer that has/had higher level in terms of level difference portion such as a ridge type semiconductor light emitting device. Furthermore, in a distributed feedback laser diode that is used for long-distance/large-capacity transmission, or fabry-perot laser diode that is used centering the subscriber's line transmission, the active layer 22 may be constructed as having a BH (Buried Heterostructure) type structure made as a multi-quantum well structure wherein the active layer has formed therein a multi-layer film. Further, the active layer 22 may be constructed as having an FBH (Flat-surface Buried Heterostructure) type structure that has a great effect of narrowing the electric current. If constructing the active layer 22 into the one having such structure, it is possible to realize a semiconductor light emitting device whose luminous efficiency has further be improved, since the crystallization of the luminous portion 28 is good.

Regarding the second electrode 34, it is sufficient that the second electrode 34 is electrically connected to the second conductivity type semiconductor layer 32 and it is the one that can be ohmic-contacted with the second conductivity type semiconductor layer 32. For example, in a case where the second conductivity type semiconductor layer 32 is an n-type one, it is preferable that the second electrode 34 be the one that is comprised of Ti/Al or the like. In a case where that layer 32 is a p-type one, it is preferable that, as the second electrode 34, Ni/Au, ZnO, ITO or the like. be used. Whichever material is used, the resulting electrode preferably becomes transparent or almost transparent, with respect to the light that has been emitted from the luminous portion 28.

Regarding the first electrode 36, it is sufficient that the first electrode 36 is electrically connected to the first conductivity type semiconductor layer 27 and it is the one that can be contacted with the first conductivity type semiconductor layer 27. For example, in a case where the first conductivity type semiconductor layer 27 is an n-type one, it is preferable that the first electrode 36 be the one that is comprised of Ti/Al or the like. In a case where that layer 27 is a p-type one, it is preferable that, as the first electrode 36, Ni/Au, ZnO, ITO or the like. be used. In a case where causing the emission of light from the active layer through the first electrode 36, this electrode preferably becomes transparent or almost transparent, with respect thereto.

Incidentally, it is preferable that, as illustrated in FIG. 6, part of the first conductivity type semiconductor layer 27 be exposed; and the first electrode 36 be formed on that exposed portion. This is because the manufacturing method involved is made easy. Namely, adopting this structure is preferable in the respect that it can be formed only by executing the photolithography, etching process steps or the like, after forming all relevant layers. Incidentally, the first electrode is not limited to that position. Needless to say, it would be sufficient if that electrode is provided at a position at which it is electrically connected to the first conductivity type semiconductor layer 27 and which enables exhibiting the effect of the invention of this application.

Seventh Embodiment

Figure 7:
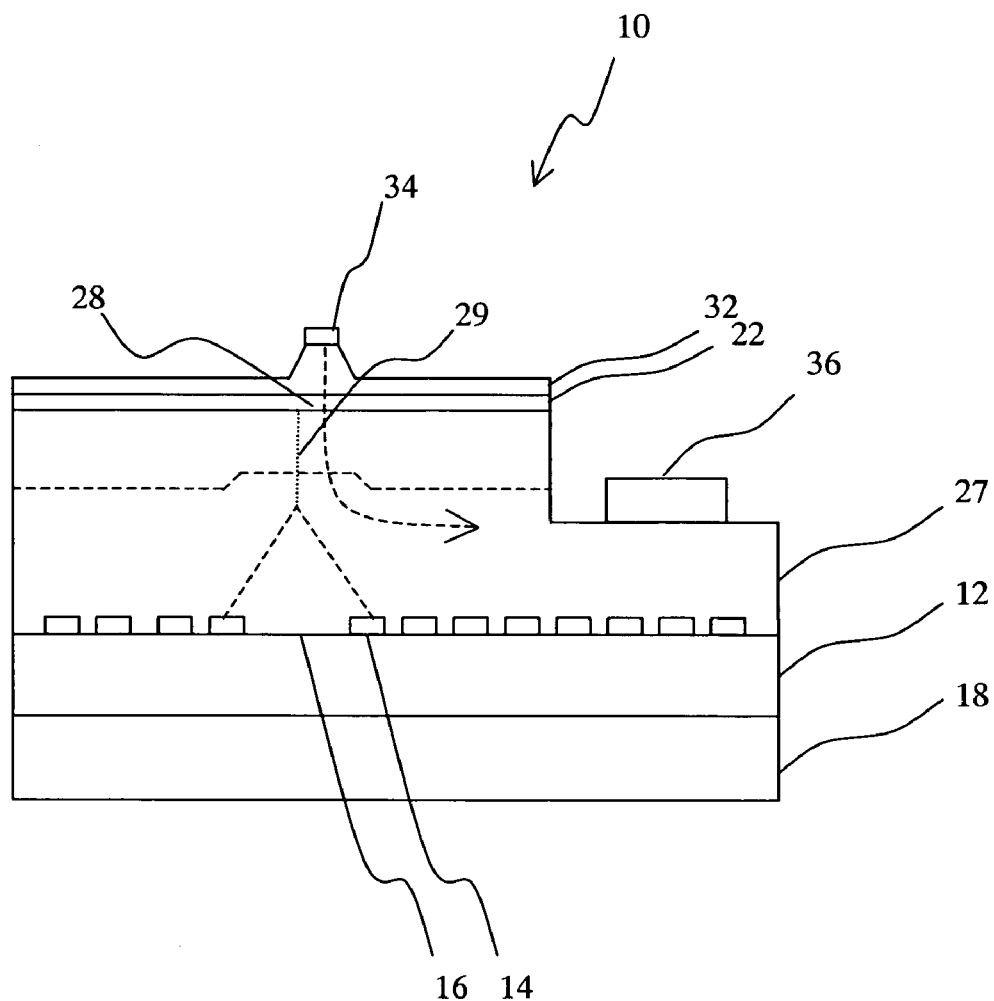
FIG. 7 is a view illustrating a gallium nitride-based semiconductor light emitting device according to the present invention.
Figure 8:
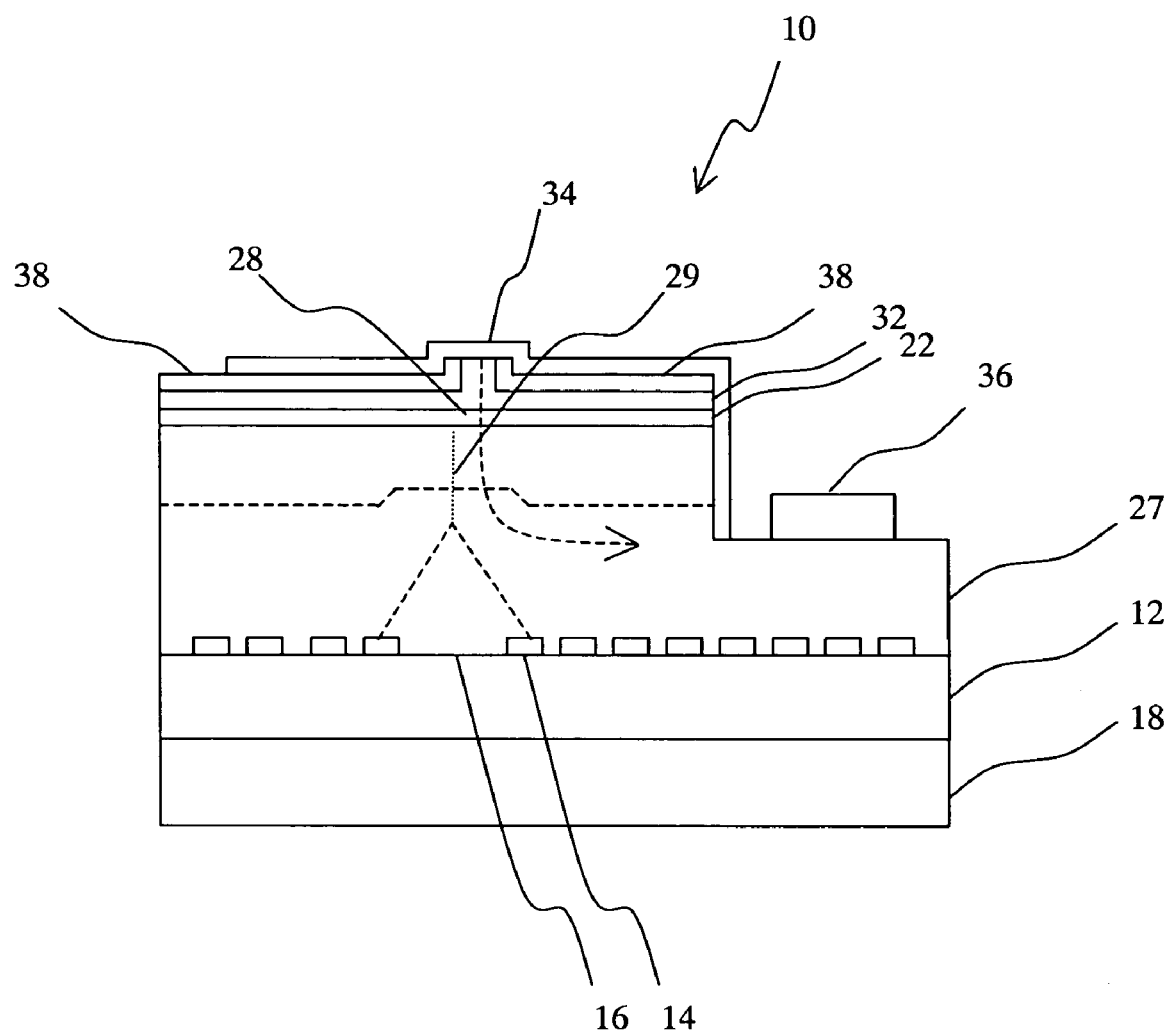
FIG. 8 is a view illustrating a gallium nitride-based semiconductor light emitting device according to the present invention.

FIGS. 7 and 8 are views illustrating examples of a gallium nitride-based semiconductor light emitting device, according to the present invention. FIGS. 7 and 8 are views that explain the structure of a gallium nitride-based semiconductor light emitting device 10. In FIGS. 7 and 8, a reference numeral 12 denotes a buffer layer, a reference numeral 14 denotes a mask, a reference numeral 16 denotes an isolating portion, a reference numeral 18 denotes a substrate, a reference numeral 22 denotes an active layer, a reference numeral 27 denotes a first conductivity type semiconductor layer, a reference numeral 28 denotes a light emitting (luminous) portion, a reference numeral 29 denotes a dislocation line that grows at the time of epitaxial selected longitudinal overgrowth, a reference numeral 32 denotes a second conductivity type semiconductor layer, a reference numeral 34 denotes a second electrode, a reference numeral 36 denotes a first electrode and a reference numeral 38 in FIG. 8 denotes an insulting film.

In FIGS. 7 and 8, there is illustrated a gallium nitride-based semiconductor light emitting device 10 which is comprised of a III group nitride-based compound that is expressed as $Al_xGa_yIn_{1-x-y}N$ (where $1 \geq x \geq 0$, $1 \geq y \geq 0$, and $1 \geq x+y \geq 0$). This device 10 includes the first conductivity type semiconductor layer 27 with respect to which processing for forming a level difference portion have been executed. Regarding the processing for forming this first conductivity type semiconductor layer having formed therein a level difference portion, the layer of course includes the ones which were explained in the above-described first to fifth embodiments. Here, there is illustrated the first conductivity type semiconductor layer 27 involving therein a level difference portion, that was explained in the first embodiment.

The plural masks 14 are provided on the buffer layer 12 in such a way that they are spaced apart from one another and the portion of the first conductivity type semiconductor layer 27 that has the higher level of its level difference portion is disposed on the isolating portion 16 whose width is greater. Further, the above-described gallium nitride-based semiconductor light emitting device 10 may further include the active layer 22 that is formed on the first conductivity type semiconductor layer 27 and part of that is used as the luminous portion 28. In FIGS. 7 and 8, the active layer 22 is provided in such away that it is sandwiched between the first conductivity type semiconductor layer 27 and the second conductivity type semiconductor layer 32. The difference between the gallium nitride-based semiconductor light emitting device in this embodiment and that in the fifth embodiment shown in FIG. 6 is location of the second electrode 34.

Here, for example, the first conductivity type semiconductor layer 27 is an n-type semiconductor (n-GaN) that has been constructed using GaN while the second conductivity type semiconductor layer 32 is a p-type semiconductor (p-GaN) that has been constructed using GaN. Each of the first conductivity type semiconductor layer 27 and second conductivity type semiconductor layer 32 is comprised of a III group nitride-based compound that is expressed as $Al_xGa_yIn_{1-x-y}N$ (where $1 \geq x \geq 0$, $1 \geq y \geq 0$, and $1 \geq x+y \geq 0$). It may be a mono-layer or multi-layer.

In that gallium nitride-based semiconductor light emitting device, the dislocation density of the active layer that is laminated on the vicinity of center spot of a portion of the first conductivity type semiconductor layer that has the higher level is lower than that of the active layer that is laminated on the center spot of the portion of the first conductivity type semiconductor layer that has the higher level and a portion of the first conductivity type semiconductor layer that has the lower level. And also the dislocation density of the active layer that is laminated on the vicinity of center spot of a portion of the first conductivity type semiconductor layer that had the higher level is lower than that of the active layer that is laminated on the center spot of the portion of the first conductivity type semiconductor layer that had the higher level and a portion of the first conductivity type semiconductor layer that had the lower level.

In FIG. 7, the gallium nitride-based semiconductor light emitting device is constructed as having a mesa shaped structure and the second electrode 34 is arranged to have narrowing of electric current at a portion of the active layer that is laminated on the vicinity of center spot of the portion of the first conductivity type semiconductor layer that has/had higher level in terms of level difference portion. And the portion of the active layer whose dislocation density is low is used as the luminous portion. Using the portion where the dislocation density is low as the luminous portion 28 enables making the gallium nitride-based semiconductor light emitting device whose luminous efficiency is high.

In FIG. 7, only the second conductivity type semiconductor layer 32 has the mesa shaped structure, but also the active layer 22 and the first conductivity type semiconductor layer 27 may have the mesa shaped structure.

In FIG. 8, the gallium nitride-based semiconductor light emitting device having a ridge shaped structure has a the second electrode 34 and narrowing of electric current at a portion of the active layer that is laminated on the portion of the first conductivity type semiconductor layer that has/had higher level in terms of level difference portion is occurred by the insulting film 38. Thereby, the portion of the active layer whose dislocation density is low is used as the luminous portion. Using the portion where the dislocation density is low as the luminous portion 28 enables making the gallium nitride-based semiconductor light emitting device whose luminous efficiency is high.

In FIG. 8, only the second conductivity type semiconductor layer 32 has the ridge shaped structure, but also the active layer 22 and the first conductivity type semiconductor layer 27 may have the ridge shaped structure.

In FIG. 7 and FIG. 8, narrowing of electric current at a portion of the active layer that is laminated on the portion of the first conductivity type semiconductor layer that has/had higher level in terms of level difference portion is occurred by the mesa shaped structure or the ridge shaped structure. However, as long as narrowing of electric current at a portion of the active layer that is laminated on the portion of the first conductivity type semiconductor layer that has/had higher level in terms of level difference portion can be occurred, the structure of the semiconductor light emitting device of this invention is not limited to the structures described above.

EFFECT OF THE INVENTION

As has been explained above, according to the present inventions, it is possible to provide a gallium nitride-based semiconductor light emitting device whose active layers have a crystal structure which is less in dislocation and good in quality.

INDUSTRIAL APPLICABILITY

A light emitting device of this invention is a gallium nitride-based semiconductor light emitting device which can be use as a high-efficiency and high-power semiconductor light emitting device.

What is claimed is:

1. A semiconductor light emitting device being a gallium nitride-based semiconductor light emitting device that is prepared by laminating a substrate, and at least a first conductivity type semiconductor layer, an active layer, and a second conductivity type semiconductor layer that are laminated on the substrate sequentially from a side of the substrate in this order, wherein the first conductivity type semiconductor layer has a level difference portion in height in the lamination direction, and an electrode formed on the second conductivity type semiconductor layer is arranged to have narrowing of an electric current at the active layer that is laminated on a portion of the first conductivity type semiconductor layer that has a higher level, wherein plural masks are provided on one surface that is perpendicular to the lamination direction and that is between the substrate and the first conductivity type semiconductor layer in the way that the masks are disposed spacing apart from each other;

and, the higher level portion of the first conductivity type semiconductor layer is disposed over the isolating portion whose width is greater than other isolating portions for the masks.

2. A semiconductor light emitting device being a gallium nitride-based semiconductor light emitting device that is prepared by laminating a substrate, and at least a first conductivity type semiconductor layer, an active layer, and a second conductivity type semiconductor layer that are laminated on the substrate sequentially from a side of the substrate in this order, wherein the first conductivity type semiconductor layer has a level difference portion in height in the lamination direction, and an electrode formed on the second conductivity type semiconductor layer is arranged to have narrowing of an electric current at the active layer that is laminated on a portion of the first conductivity type semiconductor layer that has a higher level, wherein plural buffer portions each having a different width are provided on one surface that is perpendicular to the lamination direction and that is between the substrate and the first conductivity type semiconductor layer;

and, the higher level portions of the first conductivity type semiconductor layer is disposed over the buffer portion which is wider than other buffer portions.

3. A semiconductor light emitting device being a gallium nitride-based semiconductor light emitting device that is prepared by laminating a substrate, and at least a first conductivity type semiconductor layer, an active layer, and a second conductivity type semiconductor layer that are laminated on the substrate sequentially from a side of the substrate in this order, wherein the first conductivity type semiconductor layer has a level difference portion in height in the lamination direction, and an electrode formed on the second conductivity type semiconductor layer is arranged to have narrowing of an electric current at the active layer that is laminated on a portion of the first conductivity type semiconductor layer that has a higher level, wherein a buffer layer has level difference portions in height in the lamination direction, and the higher level portion of the first conductivity semiconductor layer is disposed over the higher level portion of the buffer layer.

4. A semiconductor light emitting device being a gallium nitride-based semiconductor light emitting device that is prepared by laminating a substrate, and at least a first conductivity type semiconductor layer, an active layer, and a second conductivity type semiconductor layer that are laminated on the substrate sequentially from a side of the substrate in this order, wherein the first conductivity type semiconductor layer has a level difference portion in height in the lamination direction, and an electrode formed on the second conductivity type semiconductor layer is arranged to have narrowing of an electric current at the active layer that is laminated on a portion of the first conductivity type semiconductor layer that has a higher level, wherein the substrate has plural level difference portions in height in lamination direction and the each level has a different width, and the higher level portion of the first conductivity type semiconductor layer is disposed on the higher level portion of the substrate, whose width is greater than other higher level portions of the substrate.

5. A semiconductor light emitting device being a gallium nitride-based semiconductor light emitting device that is prepared by laminating a substrate, and at least a first conductivity type semiconductor layer, an active layer, and a second conductivity type semiconductor layer that are laminated on the substrate sequentially from a side of the substrate in this order, wherein the first conductivity type semiconductor layer has a level difference portion in height in the lamination direction, and a dislocation density of the active layer that is laminated on a portion of the first conductivity type semiconductor layer that has a higher level is lower than that of the active layer that is laminated on a portion thereof that has a lower level, wherein plural masks are provided on one surface that is perpendicular to the lamination direction and that is between the substrate and the first conductivity type semiconductor layer in the way that the masks are disposed spacing apart from each other;

and, the higher level portion of the first conductivity type semiconductor layer is disposed over the isolating portion whose width is greater than other isolating portions for the masks.

6. A semiconductor light emitting device being a gallium nitride-based semiconductor light emitting device that is prepared by laminating a substrate, and at least a first conductivity type semiconductor layer, an active layer, and a second conductivity type semiconductor layer that are laminated on the substrate sequentially from a side of the substrate in this order, wherein the first conductivity type semiconductor layer has a level difference portion in height in the lamination direction, and a dislocation density of the active layer that is laminated on a portion of the first conductivity type semiconductor layer that has a higher level is lower than that of the active layer that is laminated on a portion thereof that has a lower level, wherein plural buffer portions each having a different width are provided on one surface that is perpendicular to the lamination direction and that is between the substrate and the first conductivity type semiconductor layer;

and, the higher level portions of the first conductivity type semiconductor layer is disposed over the buffer portion which is wider than other buffer portions.

7. A semiconductor light emitting device being a gallium nitride-based semiconductor light emitting device that is prepared by laminating a substrate, and at least a first conductivity type semiconductor layer, an active layer, and a second conductivity type semiconductor layer that are laminated on the substrate sequentially from a side of the substrate in this order, wherein the first conductivity type semiconductor layer has a level difference portion in height in the lamination direction, and a dislocation density of the active layer that is laminated on a portion of the first conductivity type semiconductor layer that has a higher level is lower than that of the active layer that is laminated on a portion thereof that has a lower level, wherein a buffer layer has level difference portions in height in the lamination direction, and the higher level portion of the first conductivity semiconductor layer is disposed over the higher level portion of the buffer layer.

8. A semiconductor light emitting device being a gallium nitride-based semiconductor light emitting device that is prepared by laminating a substrate, and at least a first conductivity type semiconductor layer, an active layer, and a second conductivity type semiconductor layer that are laminated on the substrate sequentially from a side of the substrate in this order, wherein the first conductivity type semiconductor layer has a level difference portion in height in the lamination direction, and a dislocation density of the active layer that is laminated on a portion of the first conductivity type semiconductor layer that has a higher level is lower than that of the active layer that is laminated on a portion thereof that has a lower level, wherein the substrate has plural level difference portions in height in lamination direction and the each level has a different width, and the higher level portion of the first conductivity type semiconductor layer is disposed on the higher level portion of the substrate, whose width is greater than other higher level portions of the substrate.

9. A semiconductor light emitting device being a gallium nitride-based semiconductor light emitting device that is prepared by laminating a substrate, and at least a first conductivity type semiconductor layer, an active layer, and a second conductivity type semiconductor layer that are laminated on the substrate sequentially from a side of the substrate in this order,
   wherein the first conductivity type semiconductor layer has a level difference portion in height in the lamination direction, and a dislocation density of the active layer that is laminated on a vicinity of a center spot of a portion of the first conductivity type semiconductor layer that has a higher level is lower than that of the active layer that is laminated on the center spot of the portion thereof that has the higher level and a portion thereof that has a lower level,
   wherein plural masks are provided on one surface that is perpendicular to the lamination direction and that is between the substrate and the first conductivity type semiconductor layer in the way that the masks are disposed spacing apart from each other;
   and, the higher level portion of the first conductivity type semiconductor layer is disposed over the isolating portion whose width is greater than other isolating portions for the masks.

10. A semiconductor light emitting device being a gallium nitride-based semiconductor light emitting device that is prepared by laminating a substrate, and at least a first conductivity type semiconductor layer, an active layer, and a second conductivity type semiconductor layer that are laminated on the substrate sequentially from a side of the substrate in this order,
    wherein the first conductivity type semiconductor layer has a level difference portion in height in the lamination direction, and a dislocation density of the active layer that is laminated on a vicinity of a center spot of a portion of the first conductivity type semiconductor layer that has a higher level is lower than that of the active layer that is laminated on the center spot of the portion thereof that has the higher level and a portion thereof that has a lower level,
    wherein plural buffer portions each having a different width are provided on one surface that is perpendicular to the lamination direction and that is between the substrate and the first conductivity type semiconductor layer;
    and, the higher level portions of the first conductivity type semiconductor layer is disposed over the buffer portion which is wider than other buffer portions.

11. A semiconductor light emitting device being a gallium nitride-based semiconductor light emitting device that is prepared by laminating a substrate, and at least a first conductivity type semiconductor layer, an active layer, and a second conductivity type semiconductor layer that are laminated on the substrate sequentially from a side of the substrate in this order,
    wherein the first conductivity type semiconductor layer has a level difference portion in height in the lamination direction, and a dislocation density of the active layer that is laminated on a vicinity of a center spot of a portion of the first conductivity type semiconductor layer that has a higher level is lower than that of the active layer that is laminated on the center spot of the portion thereof that has the higher level and a portion thereof that has a lower level,
    wherein a buffer layer has level difference portions in height in the lamination direction, and the higher level portion of the first conductivity semiconductor layer is disposed over the higher level portion of the buffer layer.

12. A semiconductor light emitting device being a gallium nitride-based semiconductor light emitting device that is prepared by laminating a substrate, and at least a first conductivity type semiconductor layer, an active layer, and a second conductivity type semiconductor layer that are laminated on the substrate sequentially from a side of the substrate in this order,
    wherein the first conductivity type semiconductor layer has a level difference portion in height in the lamination direction, and a dislocation density of the active layer that is laminated on a vicinity of a center spot of a portion of the first conductivity type semiconductor layer that has a higher level is lower than that of the active layer that is laminated on the center spot of the portion thereof that has the higher level and a portion thereof that has a lower level,
    wherein the substrate has plural level difference portions in height in lamination direction and the each level has a different width, and the higher level portion of the first conductivity type semiconductor layer is disposed on the higher level portion of the substrate, whose width is greater than other higher level portions of the substrate.

13. A semiconductor light emitting device being a gallium nitride-based semiconductor light emitting device that is prepared by laminating a substrate, and at least a first conductivity type semiconductor layer, an active layer, and a second conductivity type semiconductor layer that are laminated on the substrate sequentially from a side of the substrate in this order,
    wherein the first conductivity type semiconductor layer has a level difference portion in height in the lamination direction, and an electrode formed on the second conductivity type semiconductor layer is arranged to have narrowing of an electric current at the active layer that is laminated on a vicinity of a center spot of the portion of the first conductivity type semiconductor layer that has a higher level,
    wherein plural masks are provided on one surface that is perpendicular to the lamination direction and that is between the substrate and the first conductivity type semiconductor layer in the way that the masks are disposed spacing apart from each other;
    and, the higher level portion of the first conductivity type semiconductor layer is disposed over the isolating portion whose width is greater than other isolating portions for the masks.

14. A semiconductor light emitting device being a gallium nitride-based semiconductor light emitting device that is prepared by laminating a substrate, and at least a first conductivity type semiconductor layer, an active layer, and a second conductivity type semiconductor layer that are laminated on the substrate sequentially from a side of the substrate in this order,
    wherein the first conductivity type semiconductor layer has a level difference portion in height in the lamination direction, and an electrode formed on the second conductivity type semiconductor layer is arranged to have narrowing of an electric current at the active layer that is laminated on a vicinity of a center spot of the portion of the first conductivity type semiconductor layer that has a higher level, wherein plural buffer portions each having a different width are provided on one surface that is perpendicular to the lamination direction and that is between the substrate and the first conductivity type semiconductor layer;

and, the higher level portions of the first conductivity type semiconductor layer is disposed over the buffer portion which is wider than other buffer portions.

15. A semiconductor light emitting device being a gallium nitride-based semiconductor light emitting device that is prepared by laminating a substrate, and at least a first conductivity type semiconductor layer, an active layer, and a second conductivity type semiconductor layer that are laminated on the substrate sequentially from a side of the substrate in this order, wherein the first conductivity type semiconductor layer has a level difference portion in height in the lamination direction, and an electrode formed on the second conductivity type semiconductor layer is arranged to have narrowing of an electric current at the active layer that is laminated on a vicinity of a center spot of the portion of the first conductivity type semiconductor layer that has a higher level, wherein a buffer layer has level difference portions in height in the lamination direction, and the higher level portion of the first conductivity semiconductor layer is disposed over the higher level portion of the buffer layer.

16. A semiconductor light emitting device being a gallium nitride-based semiconductor light emitting device that is prepared by laminating a substrate, and at least a first conductivity type semiconductor layer, an active layer, and a second conductivity type semiconductor layer that are laminated on the substrate sequentially from a side of the substrate in this order, wherein the first conductivity type semiconductor layer has a level difference portion in height in the lamination direction, and an electrode formed on the second conductivity type semiconductor layer is arranged to have narrowing of an electric current at the active layer that is laminated on a vicinity of a center spot of the portion of the first conductivity type semiconductor layer that has a higher level, wherein the substrate has plural level difference portions in height in lamination direction and the each level has a different width, and the higher level portion of the first conductivity type semiconductor layer is disposed on the higher level portion of the substrate, whose width is greater than other higher level portions of the substrate.

* * * * *